(12) United States Patent
Kim et al.

(10) Patent No.: US 11,431,326 B2
(45) Date of Patent: Aug. 30, 2022

(54) SEMICONDUCTOR DEVICE

(71) Applicant: SAMSUNG ELECTRONICS CO., LTD., Suwon-si (KR)

(72) Inventors: San Ha Kim, Suwon-si (KR); Taek Kyun Shin, Gwangmyeong-si (KR); Min Su Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/449,079

(22) Filed: Sep. 27, 2021

(65) Prior Publication Data
US 2022/0085797 A1    Mar. 17, 2022

Related U.S. Application Data

(63) Continuation of application No. 16/792,343, filed on Feb. 17, 2020, now Pat. No. 11,152,922.

(30) Foreign Application Priority Data

Jun. 13, 2019 (KR) .................. 10-2019-0069723

(51) Int. Cl.
*H03K 3/037* (2006.01)
*G01R 31/3183* (2006.01)
*H03K 19/20* (2006.01)

(52) U.S. Cl.
CPC ... *H03K 3/0372* (2013.01); *G01R 31/318371* (2013.01); *H03K 19/20* (2013.01)

(58) Field of Classification Search
CPC .................................................. H03K 3/0372

USPC ........................................................ 327/202
See application file for complete search history.

(56) References Cited

U.S. PATENT DOCUMENTS

| 5,886,901 | A | 3/1999 | Magoshi |
| 6,389,566 | B1 | 5/2002 | Wagner et al. |
| 6,853,212 | B2 | 2/2005 | Chandar et al. |
| 7,649,395 | B2 | 1/2010 | Ahmadi |
| 9,612,281 | B2 | 4/2017 | Lou et al. |
| 10,126,363 | B2 | 11/2018 | Lin et al. |
| 2008/0115025 | A1* | 5/2008 | Frederick ....... G01R 31/318541 714/732 |
| 2018/0340979 | A1 | 11/2018 | Berzins |

FOREIGN PATENT DOCUMENTS

| JP | 5058503 B9 | 8/2012 |
| KR | 1629249 B1 | 6/2016 |

* cited by examiner

*Primary Examiner* — Tomi Skibinski
(74) *Attorney, Agent, or Firm* — Volentine, Whitt & Francos, PLLC

(57) ABSTRACT

A semiconductor device includes a scan input circuit, a master latch, a slave latch, a first inverter, and a scan output circuit. The scan input circuit is configured to receive a scan input signal, a first data signal, and a scan enable signal and select any one of the first data signal and the scan input signal in response to the scan enable signal to output a first select signal. The master latch is configured to latch the first select signal and output a first output signal. The slave latch is configured to latch the first output signal and output a second output signal. The first inverter is configured to invert the second output signal. The scan output circuit is configured to receive a signal output from the slave latch and an external signal and output a first scan output signal.

14 Claims, 29 Drawing Sheets

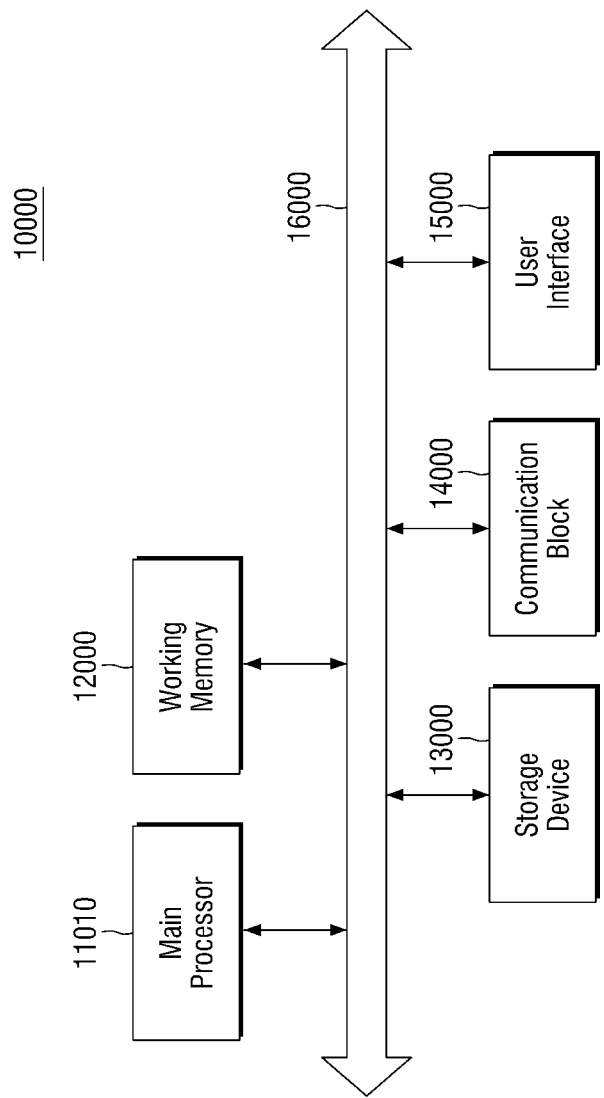

SEMICONDUCTOR DEVICE

This is a Continuation of U.S. application Ser. No. 16/792,343, filed Feb. 17, 2020, and a claim of priority is made Korean Patent Application No. 10-2019-0069723 filed on Jun. 13, 2019, in the Korean Intellectual Property Office, the disclosure of which is incorporated herein by reference in its entirety.

BACKGROUND

1. Field of the Disclosure

The present disclosure relates to a semiconductor device.

2. Description of the Related Art

As the market for mobile devices such as smart phones and tablet personal computers (PCs) increases, the demand for low power chips increases. Low power chips have features for operating mobile devices including the low power chips for a long period of time with appropriate performance using limited energy, e.g., charges charged in batteries. It may be difficult to satisfy both of the appropriate performance and low power.

Low power chips which are capable of processing digital signals include flip-flop circuits and latches. The flip-flop circuits and the latches are used as data storage elements. The data storage elements may be used to store states. The flip-flop and the latch are electronic circuits which are capable of storing and holding one-bit information and are fundamental components of a sequential logic circuit. The latch is a level-sensitive data storage element, and the flip-flop is an edge-sensitive data storage element.

As power which is consumed by flip-flop circuits and latches included in a chip increases, power consumption of a mobile device including the chip may also increase. Further, operating speeds of the flip-flop circuits and the latches included in the chip may affect an operating speed of the mobile device including the chip.

SUMMARY

Aspects of the present disclosure provide a semiconductor device including a master-slave flip-flop which consumes low power and is implemented in a small area.

Technical aspects of the present disclosure are not limited to the above-described technical aspects, and other technical aspects of the present disclosure not mentioned above should be clearly understood by those skilled in the art from the following description.

According to an aspect of the disclosure, there is provided a semiconductor device including a scan input circuit configured to receive a scan input signal, a first data signal, and a scan enable signal and select any one of the first data signal and the scan input signal in response to the scan enable signal to output a first select signal; a master latch configured to latch the first select signal to output a first output signal; a slave latch configured to latch the first output signal to output a second output signal; a first inverter configured to invert the second output signal to output a final output signal; and a scan output circuit configured to receive a signal output from the slave latch and an external signal to output a first scan output signal.

According to an aspect of the disclosure, there is provided a semiconductor device including a first scan input circuit configured to receive a scan input signal, a first data signal, and a scan enable signal and select any one of the first data signal and the scan input signal in response to the scan enable signal to output a first select signal; a first master latch configured to latch the first select signal to output a first output signal; a first slave latch configured to latch the first output signal to output a second output signal, wherein the first slave latch includes a first inverter, and the first inverter inverts the second output signal to output a third output signal; a second scan input circuit configured to receive the third output signal, a second data signal, and the scan enable signal and select any one of the second data signal and the third output signal in response to the scan enable signal to output a second select signal; a second master latch configured to latch the second select signal to output a fourth output signal; a second slave latch configured to latch the fourth select signal to output a fifth output signal; and a scan output circuit configured to receive a signal output from the second slave latch and an external signal to output a first scan output signal.

According to an aspect of the disclosure, there is provided a semiconductor device including a first scan input NAND gate configured to perform a NAND operation on a first scan input signal and a first scan enable signal to output a first output signal; a second scan input NAND gate configured to perform a NAND operation on an inverted first scan enable signal and a first data signal to output a second output signal; a first scan input circuit including a third scan input NAND gate configured to perform a NAND operation on the first output signal and the second output signal to output a third output signal; a first master latch configured to latch the third output signal to output a fourth output signal; a first slave latch configured to latch the fourth output signal to output a fifth output signal; a first inverter configured to invert the fifth output signal to output a first final output signal; a first scan output circuit configured to receive a signal output from the first slave latch and a first external signal to output a first scan output signal; a fourth scan input NAND gate configured to perform a NAND operation on an inverted second scan enable signal and a second data signal to output a sixth output signal; a second scan input circuit including a fifth scan input NAND gate configured to perform a NAND operation on the first scan output signal and the sixth output signal to output a seventh output signal; a second master latch configured to latch the seventh output signal to output an eighth output signal; a second slave latch configured to latch the eighth output signal to output a ninth output signal; a second inverter configured to invert the ninth output signal to output a second final output signal; and a second scan output circuit configured to receive a signal output from the second slave latch and a second external signal to output a second scan output signal.

BRIEF DESCRIPTION OF THE FIGURES

FIG. 24 is an exemplary block diagram of an electronic system including a semiconductor device including a master-slave flip-flop according to some embodiments of the present disclosure.

DETAILED DESCRIPTION OF THE EMBODIMENTS

Figure 1:
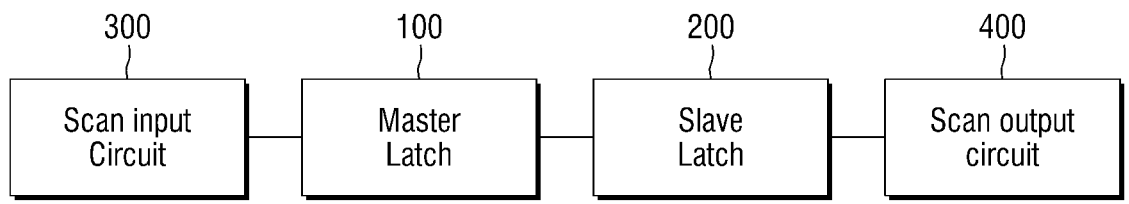
FIG. 1 is a block diagram of a semiconductor device including a master-slave flip-flop according to some embodiments of the present disclosure.
Figure 2:
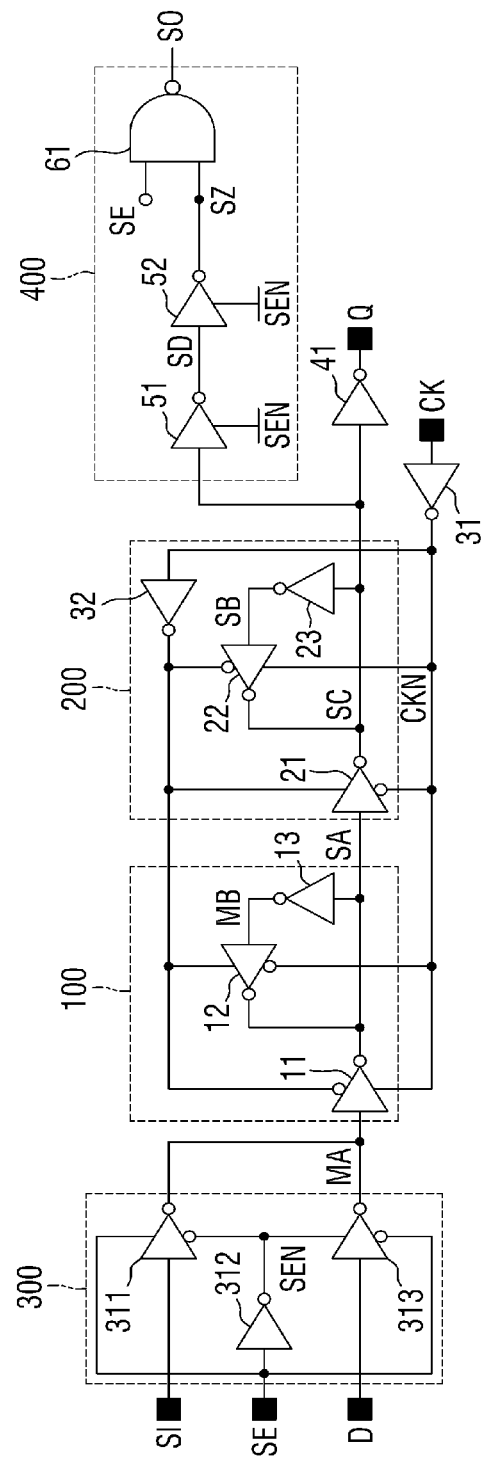
FIG. 2 is a circuit diagram of the semiconductor device including a master-slave flip-flop according to some embodiments of the present disclosure.

FIG. 1 is a block diagram of a semiconductor device including a master-slave flip-flop according to some embodiments of the present disclosure. FIG. 2 is a circuit diagram of the semiconductor device including a master-slave flip-flop according to some embodiments of the present disclosure.

Referring to FIGS. 1 and 2, the semiconductor device including a master-slave flip-flop according to some embodiments may include a master latch 100, a slave latch 200, a scan input circuit 300, and a scan output circuit 400.

The scan input circuit 300 may include a first inverter 312, a first scan tri-state inverter 311, and a second scan tri-state inverter 313. The scan input circuit 300 may receive a data signal D, a scan enable signal SE, and a scan input signal SI and output either the inverted data signal D/ or the inverted scan input signal SI/ to a first node MA in response to the scan enable signal SE.

Specifically, when the scan enable signal SE is logic high H, the scan input circuit 300 may output the inverted scan input signal SI/ to the first node MA. That is, the first scan tri-state inverter 311, which is enabled in response to the scan enable signal SE of logic high H, may output the inverted scan input signal SI/ to the first node MA.

On the contrary, when the scan enable signal SE is logic low L, the scan input circuit 300 may output the inverted data signal D/ to the first node MA. For example, the second scan tri-state inverter 313, which is enabled in response to the scan enable signal SE of logic low L, may output the inverted data signal D/ to the first node MA.

The inverted scan input signal SI/ or the inverted data signal D/, which is output from the scan input circuit 300 to the first node MA, may be a first select signal.

Figure 20:
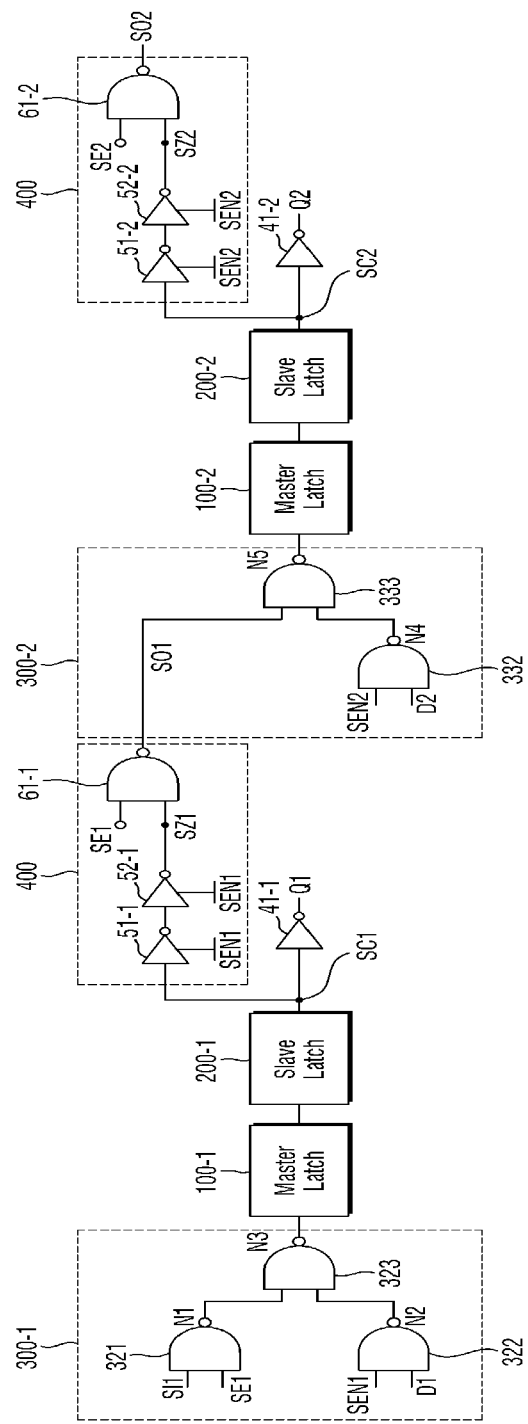
FIG. 20 is a circuit diagram of a semiconductor device including two master-slave flip-flops, which are connected in series, according to some embodiments of the present disclosure.

A configuration of the scan input circuit 300 shown in FIG. 2 is illustrative, and the present disclosure is not limited thereto. For example, the scan input circuit 300 may be implemented with a plurality of transmission gates, a multiplexer, or logic gates, which will be described below, as shown in FIG. 20.

The master latch 100 may include a first input tri-state inverter 11, a first master latch tri-state inverter 12, and a second inverter 13.

The master latch 100 may store the inverted data signal D/ which is input through the first node MA and output the data signal D to a second node SA. Specifically, the master latch 100 may output the data signal D, which is acquired according to a first clock signal CK and a second clock signal CKN that is an inversion of the first clock signal CK, to the second node SA.

The signal output to the second node SA may be a first output signal.

Specifically, the first input tri-state inverter 11 may receive the inverted data signal D/ from the first node MA and, when the first clock signal CK is logic low L and the second clock signal CKN is logic high H, the first input tri-state inverter 11 may invert the inverted data signal D/ to output the data signal D to the second node SA. On the contrary, when the first clock signal CK is logic high H and the second clock signal CKN is logic low L, the first input tri-state inverter 11 may block the first master latch tri-state inverter 12 from the first node MA.

An output terminal of the first master latch tri-state inverter 12 may be connected to an output terminal of the first input tri-state inverter 11. The first master latch tri-state inverter 12 may invert an output signal provided from the second inverter 13 to output the inverted output signal to the second node SA.

Specifically, when the first clock signal CK is logic high H and the second clock signal CKN is logic low L, the first master latch tri-state inverter 12 may invert a signal, which is output from the second inverter 13 to a third node MB, to output the inverted signal to the second node SA. On the contrary, when the first clock signal CK is logic low L and the second clock signal CKN is logic high H, the first master latch tri-state inverter 12 may block the first input tri-state inverter 11 from the second node SA.

The slave latch 200 may include a second input tri-state inverter 21, a second master latch tri-state inverter 22, a third inverter 23, and a fourth inverter 32. The slave latch 200 may operate similarly to the master latch 100 which is described above.

Specifically, the slave latch 200 may store the data signal D, which is input through the second node SA, and output the inverted data signal D/ to a fifth node SC. Specifically, the slave latch 200 may output the inverted data signal D/, whose inverse is input to the second node SA, in response to the first clock signal CK and the second clock signal CKN.

Specifically, the second input tri-state inverter 21 may receive the data signal D from the second node SA. When the first clock signal CK is logic high H and the second clock signal CKN is logic low L, the second input tri-state inverter 21 may invert the data signal D to output the inverted data signal D/ to the fifth node SC. On the contrary, when the first clock signal CK is logic low L and the second clock signal CKN is logic high H, the second input tri-state inverter 21 may block the data signal D, which is input, from the second node SA.

The second master latch tri-state inverter 22 may be connected to an output terminal of the second input tri-state inverter 21. The second master latch tri-state inverter 22 may invert an output signal provided from the third inverter 23 to output the inverted output signal to the fifth node SC.

Specifically, when the first clock signal CK is logic low L and the second clock signal CKN is logic high H, the second master latch tri-state inverter 22 may invert a signal, which is output from the third inverter 23 to node SB, to output the inverted signal to the fifth node SC. On the contrary, when the first clock signal CK is logic high H and the second clock signal CKN is logic low L, the second master latch tri-state inverter 22 may block the second input tri-state inverter 21 from the second node SA.

The semiconductor device including a master-slave flip-flop according to some embodiments may receive the first clock signal CK and the second clock signal CKN. As shown in FIG. 2, the first clock signal CK and the second clock signal CKN may be provided to the semiconductor device including the master-slave flip-flop through a fourth inverter 32 and a fifth inverter 31. That is, for example, the first clock signal CK may be directly provided from a clock terminal and the second clock signal CKN may be input as a clock signal which is inverted through the fifth inverter 31. The second clock signal CKN is inverted by the fourth inverter 32 in the slave latch 200 so that the first clock signal CK may be output.

The slave latch 200 may output an output signal to the fifth node SC, and a fifth inverter 41 may invert the output signal to output a final output signal Q.

The semiconductor device including the master-slave flip-flop according to some embodiments includes the scan output circuit 400 connected to the fifth node SC.

The scan output circuit 400 may include a first scan output inverter 51, a second scan output inverter 52, and a logic operation gate which performs a logic operation on input values. In the semiconductor device including the master-slave flip-flop according to some embodiments, the logic gate may include a scan output NAND gate 61 which performs a logic NAND operation on input values.

The scan output circuit 400 may receive an output signal of the fifth node SC and an external signal. As described above, the output signal is a signal which is output to the fifth node SC by the slave latch 200, and the external signal may include the scan enable signal SE.

When the semiconductor device including the master-slave flip-flop according to some embodiments is not in a scan test mode, the scan enable signal SE is logic low L. Consequently, an inverted scan enable signal SEN is logic high H.

The scan enable signal SE input to the scan output circuit 400 may be input to the scan output NAND gate 61 in the scan output circuit 400. Further, the output signal, which is input to the scan output circuit 400, may be input to the first scan output inverter 51 so that a first output signal, which is an inversion of the output signal, may be output to a sixth node SD. The first output signal may be input to the second scan output inverter 52 so that a second output signal, which is an inversion of the first output signal, may be output to a final output node SZ.

The scan output NAND gate 61 receives the scan enable signal SE of logic low L and the second output signal of the final output node SZ and performs a logic NAND operation on the scan enable signal SE and the second output signal, thereby outputting a scan output signal SO.

In the case of not being in the scan test mode, the scan output signal SO may be fixed to logic high H due to the logic NAND operation.

That is, in the case of not being in the scan test mode, when the scan output signal SO is fixed to logic high H, it may be determined that the semiconductor device including the master-slave flip-flop operates normally.

When the semiconductor device including the master-slave flip-flop according to some embodiments is in the scan test mode, the scan enable signal SE is logic high H. Consequently, the inverted scan enable signal SEN is logic low L.

In this case, the scan output NAND gate 61 receives the scan enable signal SE of logic high H and the second output signal of the final output node SZ and performs a logic NAND operation on the scan enable signal SE and the second output signal, thereby outputting the scan output signal SO.

In the scan test mode, the scan output signal SO is equal to the final output signal Q due to the logic NAND operation.

In the semiconductor device including the master-slave flip-flop according to some embodiments, the inverted scan enable signal SEN may be input to ground terminals of the first scan output inverter 51 and the second scan output inverter 52 of the scan output circuit 400.

In the case of not being in the scan test mode, the inverted scan enable signal SEN is logic high H so that the first scan output inverter 51 and the second scan output inverter 52 do not operate. That is, in the case of not being in the scan test mode, the number of unnecessary operations of components in the scan output circuit 400 is reduced so that it is possible to reduce unnecessary power which is consumed by the semiconductor device including the master-slave flip-flop.

In the scan test mode, the inverted scan enable signal SEN is logic low L so that the first scan output inverter 51 and the second scan output inverter 52 may operate as normal inverters. That is, the output signal, which is output to the fifth node SC by the slave latch 200, may be transmitted to the scan output NAND gate 61, and the scan output signal SO output from the scan output NAND gate 61 may be equal to the final output signal Q.

In the case of not being in the scan test mode, the semiconductor device including the master-slave flip-flop according to some embodiments may prevent the operations of the first scan output inverter 51 and the second scan output inverter 52. Further, owing to the inverted scan enable signal SEN input to the ground terminals of the first scan output inverter 51 and the second scan output inverter 52, a path of a leakage current which may occur in the semiconductor device including the master-slave flip-flop is made to be long so that power consumed by the semiconductor device including the master-slave flip-flop may be reduced.

In the case of being in the scan test mode, the first scan output inverter 51 and the second scan output inverter 52 of the semiconductor device including the master-slave flip-flop according to some embodiments may operate as general inverters and have delays extending as much as the first scan output inverter 51 and the second scan output inverter 52. In the scan test mode, it may be preferable to maintain a longer delay and, to this end, a plurality of buffers (or inverters) may be required. When the buffers (or inverters) for delays are added outside the master-slave flip-flop, a proportion of the buffers (or inverters) occupying in the semiconductor device may increase and unnecessary power consumption may increase. Thus, as in the semiconductor device including the master-slave flip-flop according to some embodiments, the first scan output inverter 51 and the second scan output inverter 52, which serve as a plurality of buffers (or inverters) for delays, are embedded in the master-slave flip-flop so that it is possible to reduce areas for delays provided in the semiconductor device and reduce unnecessary power consumption.

FIGS. 3A to 3D are circuit diagrams of tri-state inverters included in the semiconductor device including the master-slave flip-flop according to some embodiments of FIG. 2.

Figure 3A:
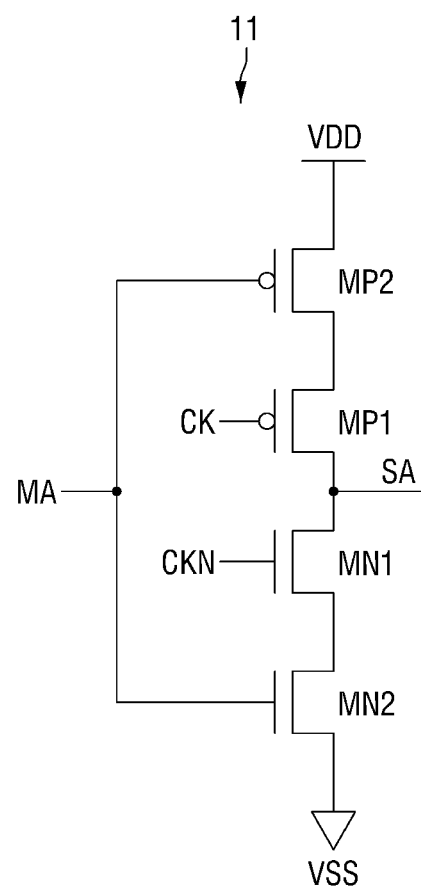
FIGS. 3A to 3D are circuit diagrams of tri-state inverters included in the semiconductor device including the master-slave flip-flop according to some embodiments of FIG. 2.

Referring to FIG. 3A first, the first input tri-state inverter 11 may include a first NMOS transistor MN1, a second NMOS transistor MN2, a first PMOS transistor MP1, and a second PMOS transistor MP2. The first NMOS transistor MN1, the second NMOS transistor MN2, the first PMOS transistor MP1, and the second PMOS transistor MP2 may be disposed in series between a power supply voltage VDD and a ground voltage VSS.

A detailed operation of the first input tri-state inverter 11 has been described above, and a description thereof will be omitted below. That is, the inverted data signal D/ input to the first node MA may be controlled to be output to the second node SA in inverted form as data signal D due to the first PMOS transistor MP1 and the first NMOS transistor MN1 which are gated in response to the first clock signal CK and the second clock signal CKN.

Figure 3B:
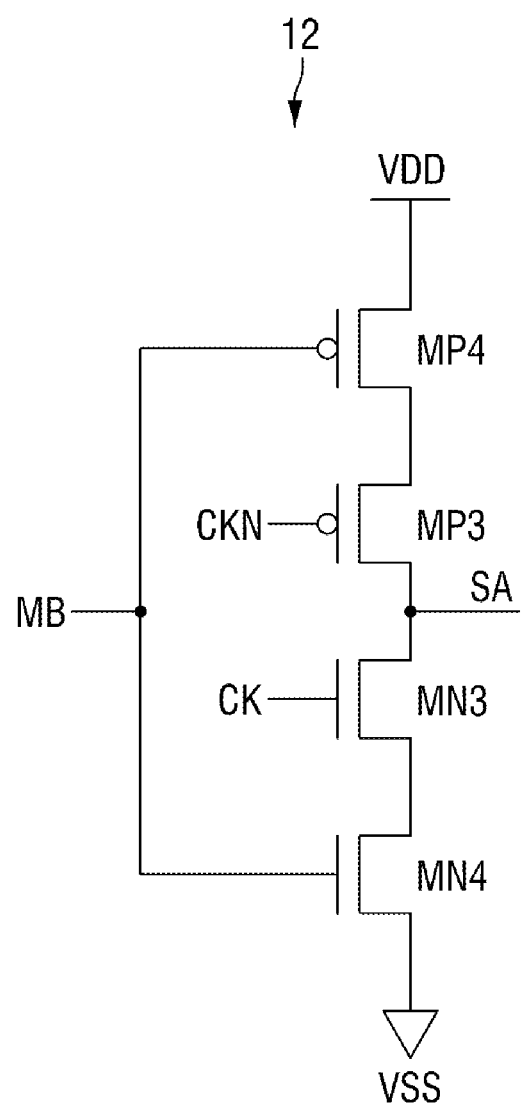

Referring to FIG. 3B, the first master latch tri-state inverter 12 may include a third NMOS transistor MN3, a fourth NMOS transistor MN4, a third PMOS transistor MP3, and a fourth PMOS transistor MP4. The third NMOS transistor MN3, the fourth NMOS transistor MN4, the third PMOS transistor MP3, and the fourth PMOS transistor MP4 may be disposed in series between the power supply voltage VDD and the ground voltage VSS.

A detailed operation of the first master latch tri-state inverter 12 has also been described above, and a description thereof will be omitted below. That is, the signal input to the third node MB may be controlled to be output to the second node SA due to the third NMOS transistor MN3 and the third PMOS transistor MP3 which are gated in response to the first clock signal CK and the second clock signal CKN.

Figure 3C:
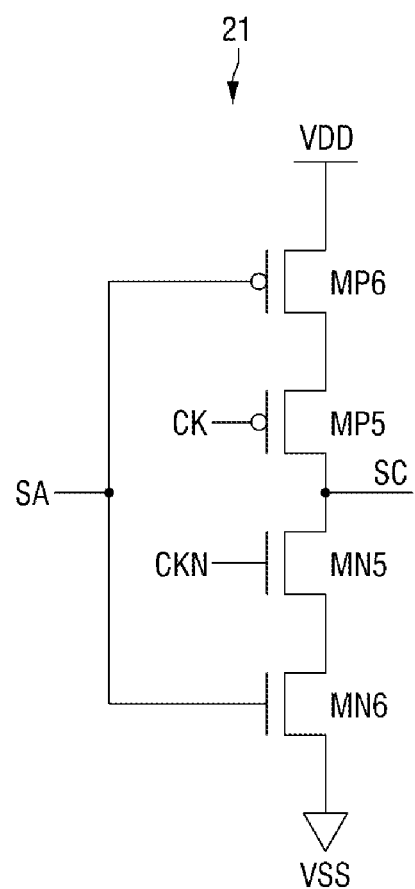

Referring to FIG. 3C, the second input tri-state inverter 21 may include a fifth NMOS transistor MN5, a sixth NMOS transistor MN6, a fifth PMOS transistor MP5, and a sixth PMOS transistor MP6 which are connected in series between the power supply voltage VDD and the ground voltage VSS.

In the second input tri-state inverter 21, the data signal D input to the second node SA may be controlled to be output to the fifth node SC in inverted form due to the fifth NMOS transistor MN5 and the fifth PMOS transistor MP5 which are gated in response to the first clock signal CK and the second clock signal CKN.

Figure 3D:
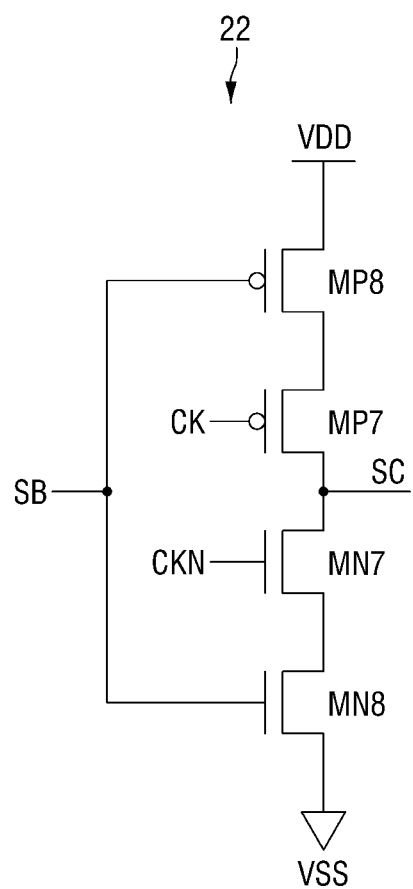

Referring to FIG. 3D, the second master latch tri-state inverter 22 may include a seventh NMOS transistor MN7, an eighth NMOS transistor MN8, a seventh PMOS transistor MP7, and an eighth PMOS transistor MP8 which are connected in series between the power supply voltage VDD and the ground voltage VSS.

In the second master latch tri-state inverter 22, the signal input to the fourth node SB may be controlled to be output to the fifth node SC in inverted form due to the seventh PMOS transistor MP7 and the seventh NMOS transistor MN7 which are gated in response to the first clock signal CK or the second clock signal CKN.

Figure 4A:
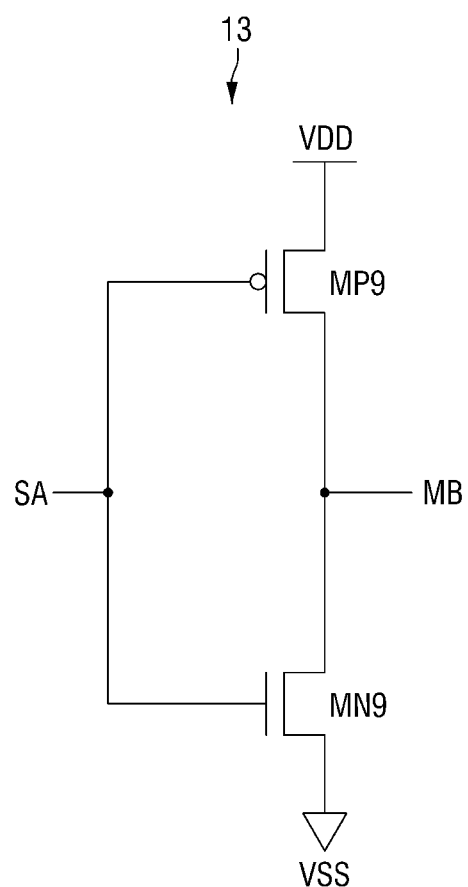
FIGS. 4A to 4C are circuit diagrams of inverters included in the semiconductor device including the master-slave flip-flop according to some embodiments of FIG. 2.
Figure 4B:
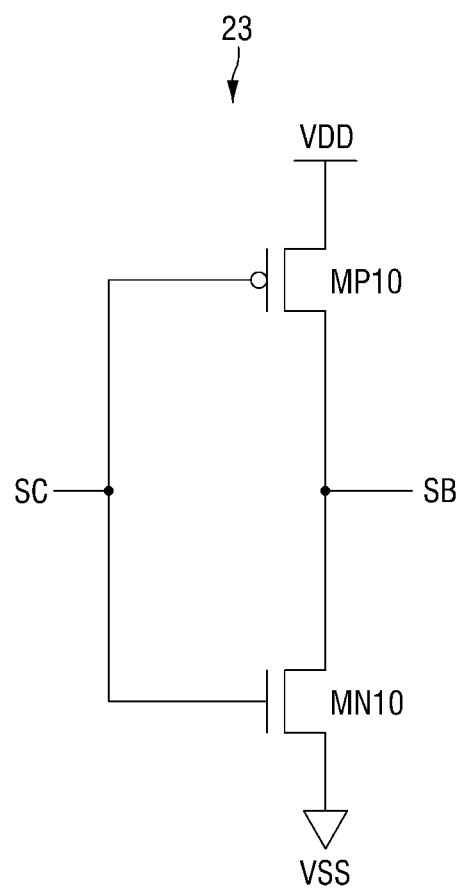
Figure 4C:
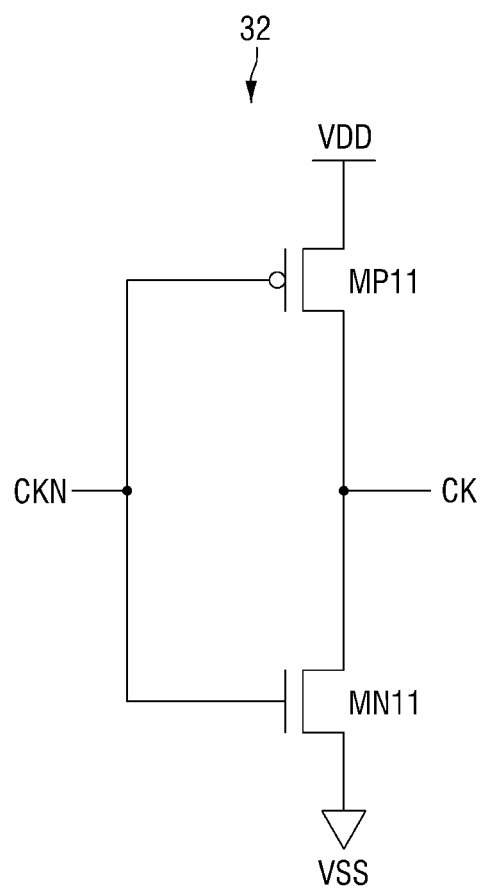

FIGS. 4A to 4C are circuit diagrams of inverters included in the semiconductor device including the master-slave flip-flop according to some embodiments of FIG. 2.

Referring to FIG. 4A, the second inverter 13 may be implemented by connecting a ninth PMOS transistor MP9, which is gated in response to a voltage level of the second node SA to provide the power supply voltage VDD to the third node MB, to a ninth NMOS transistor MN9 which is gated in response to a voltage level of the second node SA to provide the ground voltage VSS to the third node MB.

Referring to FIG. 4B, the third inverter 23 may be implemented by connecting a tenth PMOS transistor MP10, which is gated in response to a voltage level of the fifth node SC to provide the power supply voltage VDD to the fourth node SB, to a tenth NMOS transistor MN10 which is gated in response to a voltage level of the fifth node SC to provide the ground voltage VSS to the fourth node SB.

Referring to FIG. 4C, the fourth inverter 32 may be implemented by connecting an eleventh PMOS transistor MP11, which is gated in response to a voltage level of the second clock signal CKN to provide the power supply voltage VDD as the first clock signal CK, to an eleventh NMOS transistor MN11 which is gated in response to the voltage level of the second clock signal CKN to provide the ground voltage VSS as the first clock signal CK.

Figure 5:
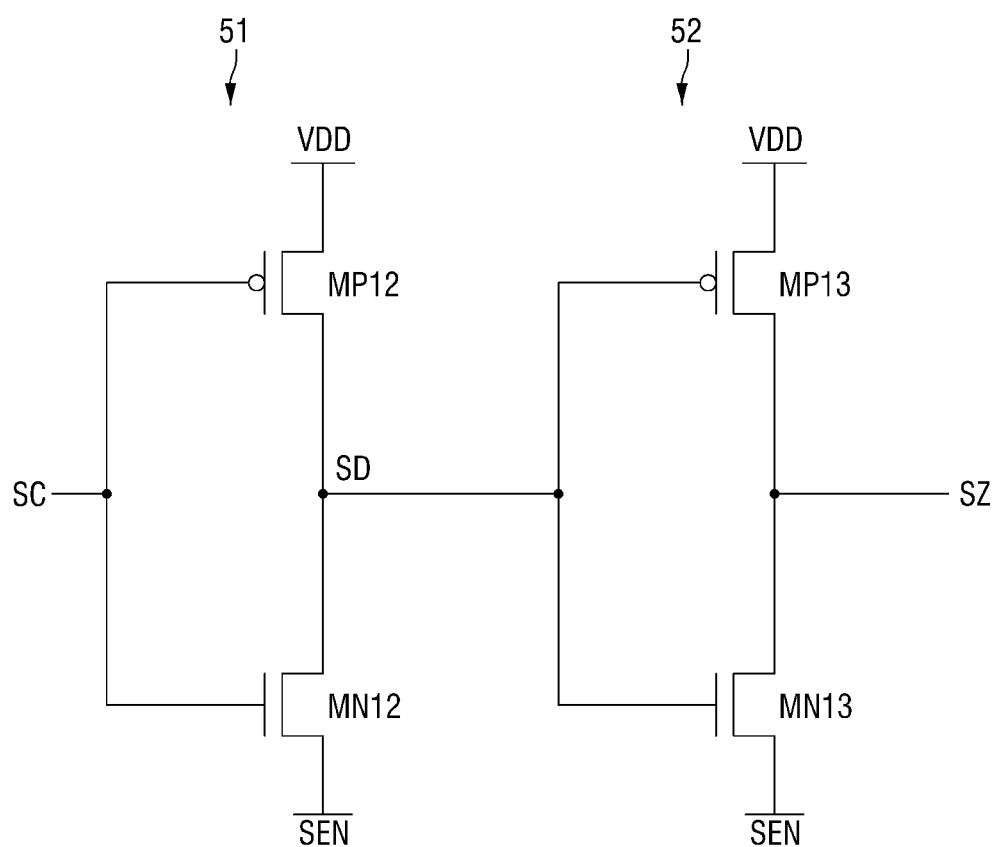
FIG. 5 shows circuit diagrams of a plurality of scan output inverters included in the semiconductor device including the master-slave flip-flop according to some embodiments of FIG. 2.

FIG. 5 shows circuit diagrams of a plurality of scan output inverters included in the semiconductor device including the master-slave flip-flop according to some embodiments of FIG. 2. For reference, contents of a basic operation and a configuration of an inverter, which duplicate the above detailed description, will be omitted in the following description.

Referring to FIG. 5, the first scan output inverter 51 may include a twelfth PMOS transistor MP12 and a twelfth NMOS transistor MN12. The first scan output inverter 51 may be gated in response to a voltage level of the fifth node SC and invert the voltage level of the fifth node SC to output the inverted voltage level to the sixth node SD. The second scan output inverter 52 may include a thirteenth PMOS transistor MP13 and a thirteenth NMOS transistor MN13. The second scan output inverter 52 may be gated in response to a voltage level of the sixth node SD and invert the voltage level of the sixth node SD to output the inverted voltage level to the final output node SZ.

Figure 6:
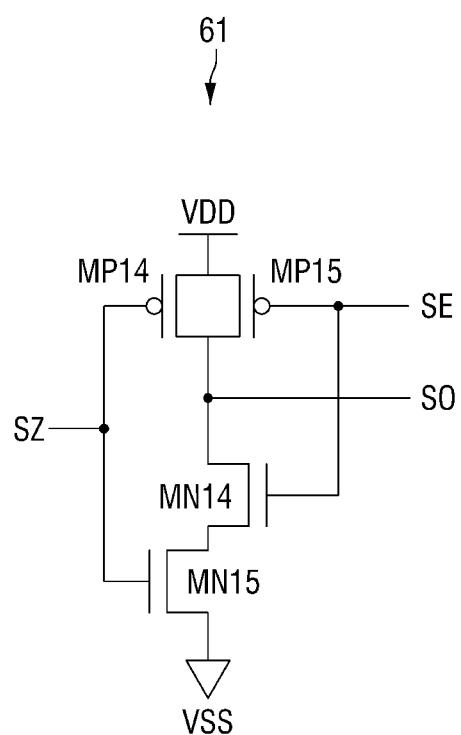
FIG. 6 is a circuit diagram of a scan output NAND gate included in the semiconductor device including the master-slave flip-flop according to some embodiments of FIG. 2.

FIG. 6 is a circuit diagram of a scan output NAND gate 61 included in the semiconductor device including the master-slave flip-flop according to some embodiments of FIG. 2.

Referring to FIG. 6, source terminals of a fourteenth PMOS transistor MP14 and a fifteenth PMOS transistor MP15 are connected to the power supply voltage VDD, drain terminals thereof are connected to each other, and the drain terminals are connected to a drain terminal of a fourteenth NMOS transistor MN14 so that the scan output signal SO may be output. The fourteenth PMOS transistor MP14 may be gated in response to a voltage level of the final output node SZ, and the fifteenth PMOS transistor MP15 may be gated in response to the scan enable signal SE. A drain terminal of a fifteenth NMOS transistor MN15 is connected in series to a source terminal of the fourteenth NMOS transistor MN14. A source terminal of the fifteenth NMOS transistor MN15 may be connected to ground voltage VSS. The fifteenth NMOS transistor MN15 may be gated in response to the voltage level of the final output node SZ, and the fourteenth NMOS transistor MN14 may be gated in response to the scan enable signal SE.

Logic operations in cases in which the scan output NAND gate 61 is in the scan test mode and is not in the scan test mode are the same as the above-described logic operations, and thus a description thereof will be omitted below.

Figure 7:
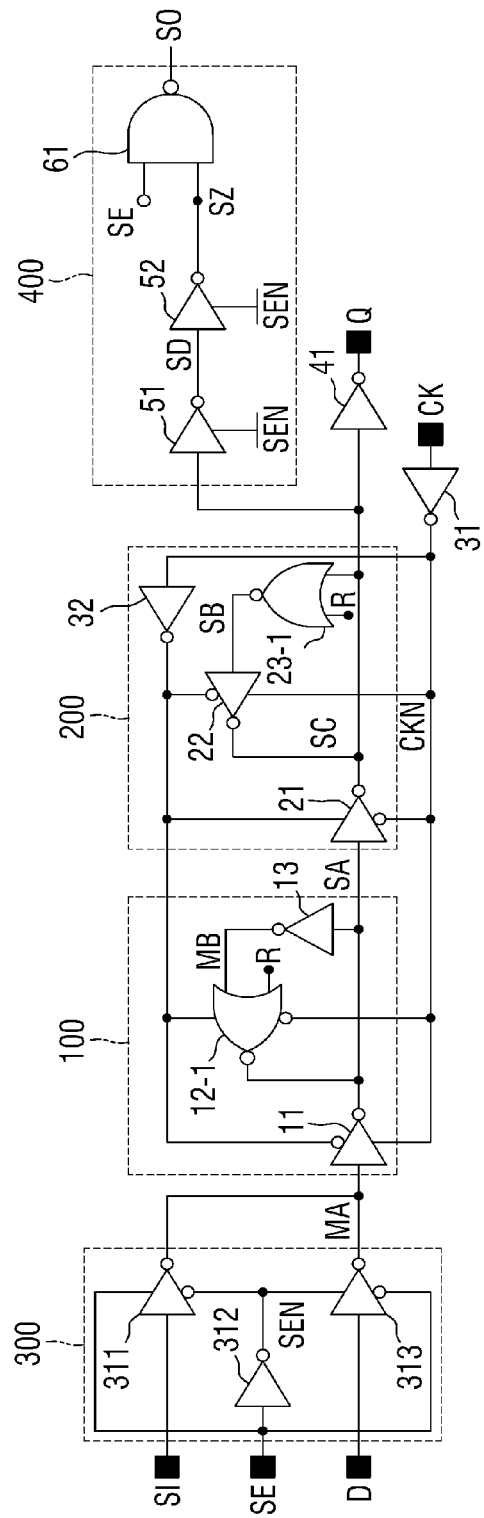
FIG. 7 is a circuit diagram of the semiconductor device including a master-slave flip-flop according to some embodiments of the present disclosure.

FIG. 7 is a circuit diagram of the semiconductor device including a master-slave flip-flop according to some embodiments of the present disclosure.

Referring to FIG. 7, in a master latch 100, an output terminal of a reset NOR gate 12-1 which receives a reset signal R may be connected to a first input tri-state inverter 11 unlike FIG. 2. Further, the reset NOR gate 12-1 may receive a signal from a third node MB as an input. Other operations of the master latch 100 are the same as those of FIG. 2. Further, unlike FIG. 2, in a slave latch 200, an output terminal of a reset NOR gate 23-1 which receives a reset signal R may be connected to a fourth node SB, and the reset NOR gate 23-1 may receive a signal from a fifth node SC as an input. Other operations of the slave latch 200 are the same as those of FIG. 2. That is, when the reset signal R is "1," the final output signal Q may be fixed to "0."

Figure 8:
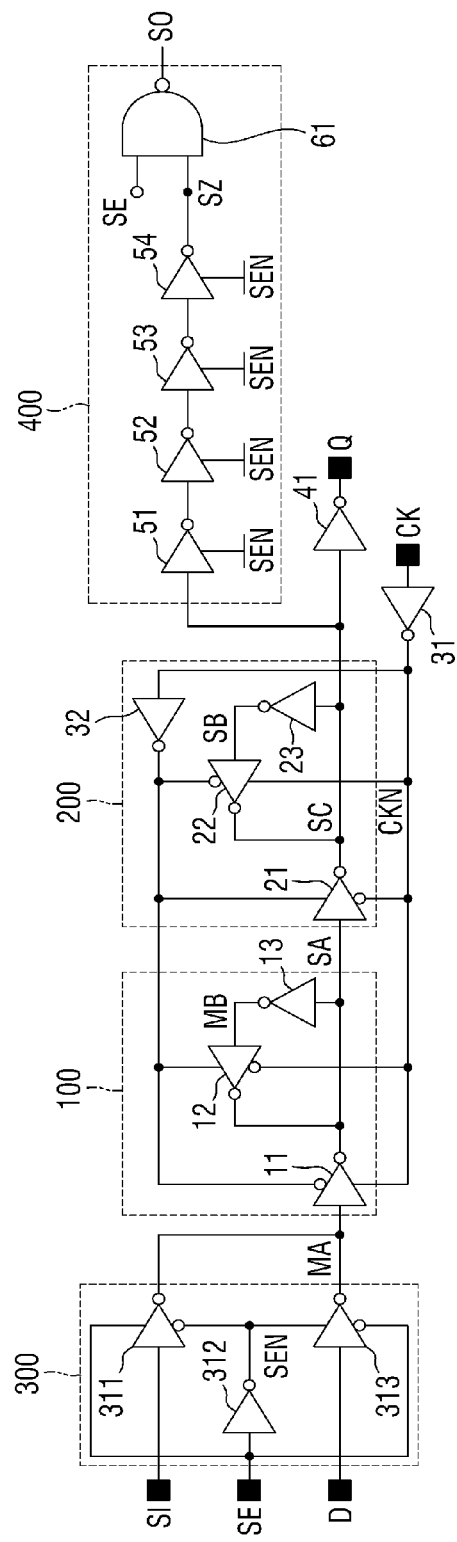
FIG. 8 is a circuit diagram of the semiconductor device including a master-slave flip-flop according to some embodiments of the disclosure.

FIG. 8 is a circuit diagram of the semiconductor device including a master-slave flip-flop according to some embodiments of the disclosure.

Referring to FIG. 8, unlike the scan output circuit 400 of FIG. 2, a scan output circuit 400 further includes a third scan output inverter 53 and a fourth scan output inverter 54. Consequently, in the case of being in a scan test mode, a delay time may be made to be longer while a pin polarity of a scan output signal SO is maintained to be equal to that of a final output signal Q.

In a condition in which the pin polarity of the scan output signal SO is maintained to be equal to that of the final output signal Q, the number of scan output inverters in the scan output circuit 400 is not limited to the above configuration, and the scan output circuit 400 may further include 2n scan output inverters (where n is a natural number other than zero).

Other operations and configurations are the same as those of FIG. 2, and thus a duplicate description will be omitted below.

Figure 9:
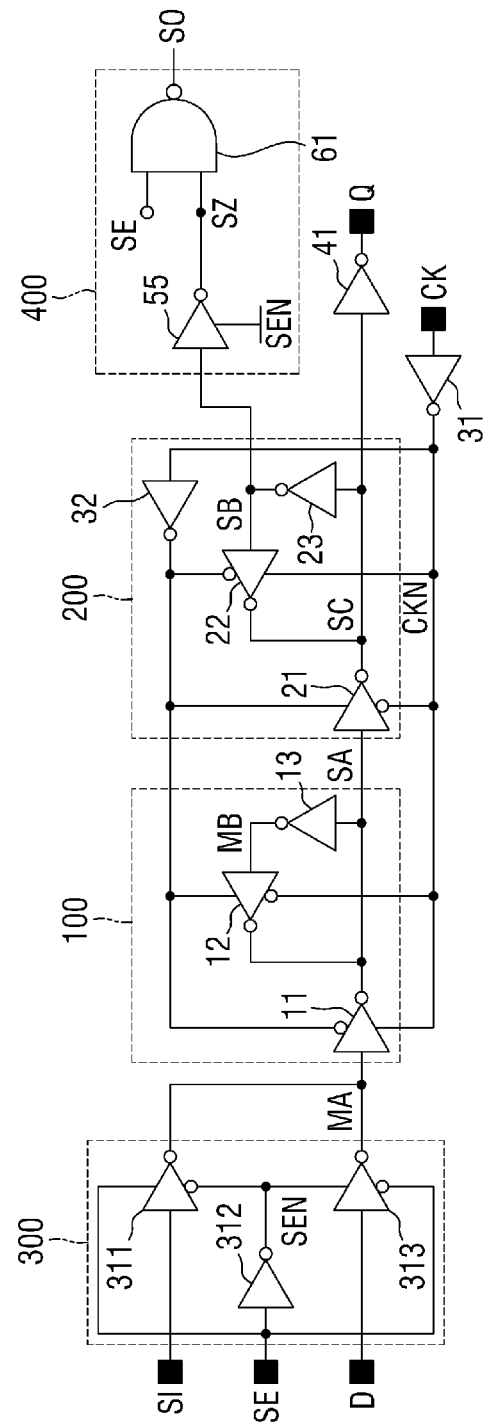
FIG. 9 is a circuit diagram of the semiconductor device including a master-slave flip-flop according to some embodiments of the present disclosure.

FIG. 9 is a circuit diagram of the semiconductor device including a master-slave flip-flop according to some embodiments of the present disclosure.

Referring to FIG. 9, a scan output circuit 400 receives an output signal from a fourth node SB unlike FIG. 2. That is, the scan output circuit 400 according to some embodiments may include a fifth scan output inverter 55. The fifth scan output inverter 55 may receive a signal output from the fourth node SB in a slave latch 200 and transmit the inverted output signal to a final output node SZ, and a scan output NAND gate 61 may perform a logic NAND operation on the scan enable signal SE and a signal of the final output node SZ to output a scan output signal SO.

A detailed operation is similar to that of FIG. 2, and thus a description thereof will be omitted below.

Figure 10:
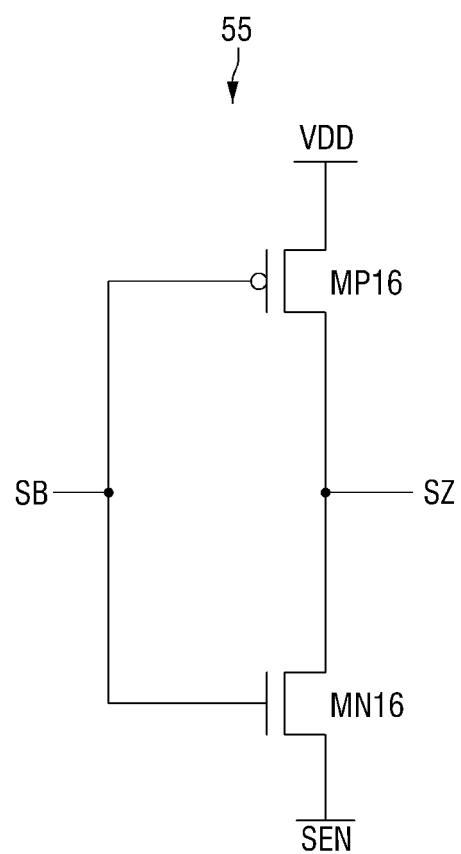
FIG. 10 is a circuit diagram of an inverter included in the semiconductor device including the master-slave flip-flop according to some embodiments of FIG. 9.

FIG. 10 is a circuit diagram of an inverter included in the semiconductor device including the master-slave flip-flop according to some embodiments of FIG. 9.

Referring to FIG. 10, the fifth scan output inverter 55 may include a sixteenth PMOS transistor MP16 and a sixteenth NMOS transistor MN16 which are connected in series between the power supply voltage VDD and the inverted scan enable signal SEN. The fifth scan output inverter 55 may be gated in response to a voltage level of the fourth node SB and may invert the voltage level of the fourth node SB to output the inverted voltage level to the final output node SZ. A detailed operation is the same as that of FIG. 4A, and thus a description thereof will be omitted below.

Figure 11:
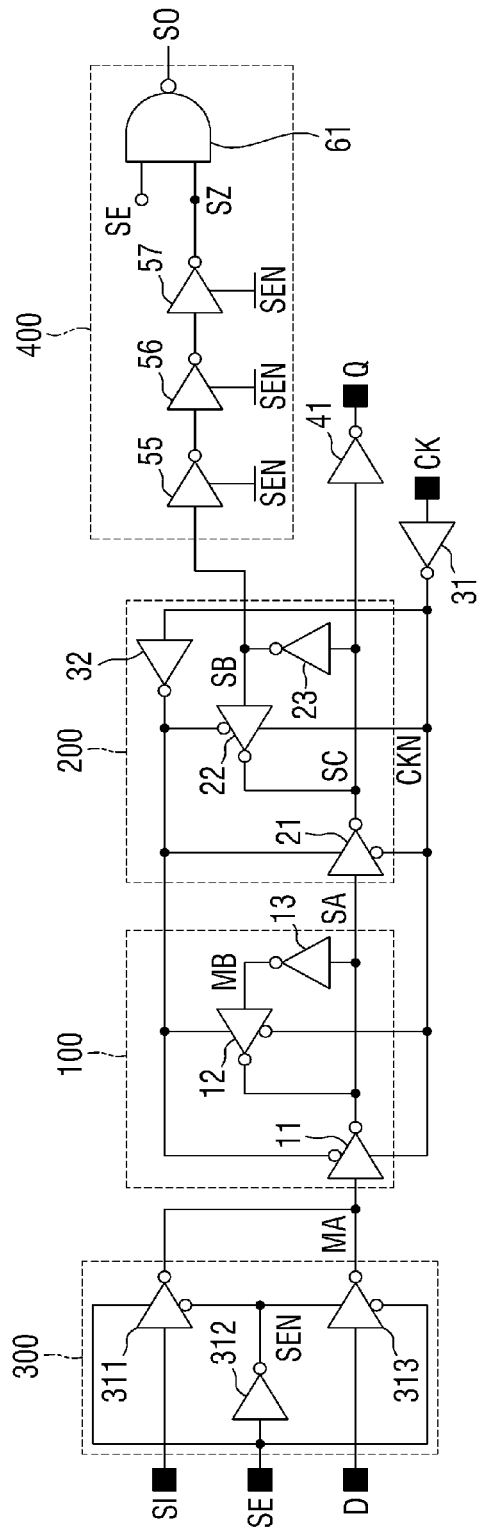
FIG. 11 is a circuit diagram of the semiconductor device including a master-slave flip-flop according to some embodiments of the present disclosure.

FIG. 11 is a circuit diagram of the semiconductor device including a master-slave flip-flop according to some embodiments of the present disclosure.

Referring to FIG. 11, a scan output circuit 400 may further include a sixth scan output inverter 56 and a seventh scan output inverter 57 unlike FIG. 9. Consequently, in the case of being in a scan test mode, a delay time may be made to be longer while a pin polarity of a scan output signal SO is maintained to be equal to that of a final output signal Q.

In a condition in which the pin polarity of the scan output signal SO is maintained to be equal to that of the final output signal Q, the number of scan output inverters in the scan output circuit 400 is not limited to the above configuration, and the scan output circuit 400 may further include 2n+1 scan output inverters (where n is a natural number other than zero).

Other operations and configurations are the same as those of FIG. 2, and thus a duplicate description will be omitted below.

Figure 12:
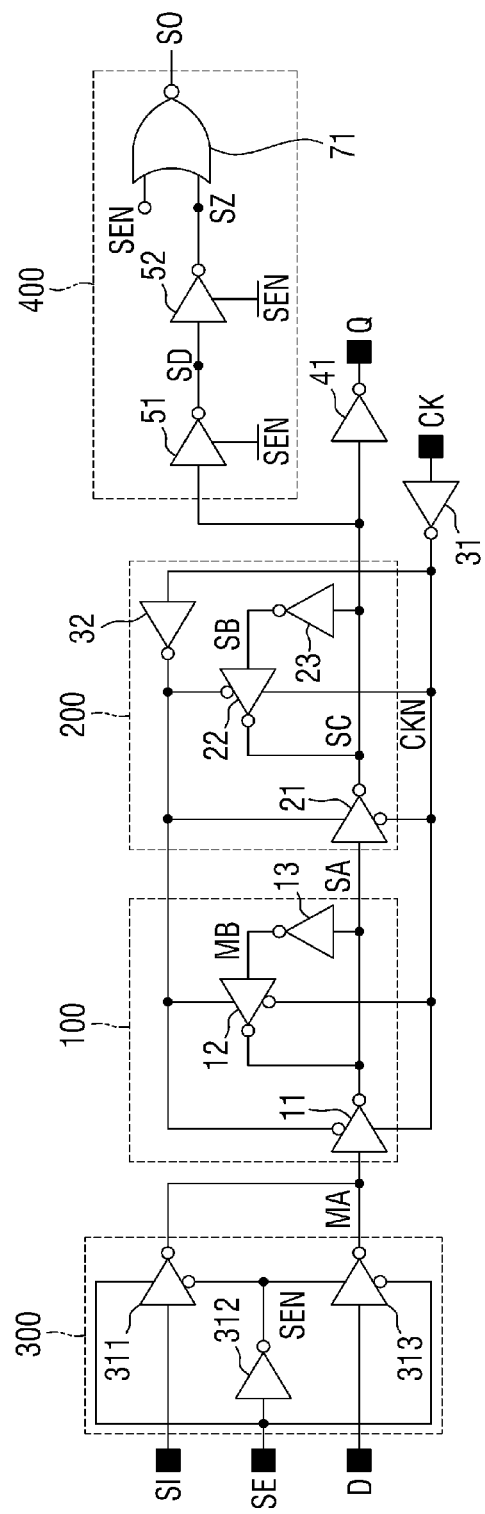
FIG. 12 is a circuit diagram of the semiconductor device including a master-slave flip-flop according to some embodiments of the present disclosure.

FIG. 12 is a circuit diagram of the semiconductor device including a master-slave flip-flop according to some embodiments of the present disclosure.

Referring to FIG. 12, a logic operation gate of a scan output circuit 400 may include a scan output NOR gate 71 which performs a logic NOR operation on input values unlike FIG. 2.

Further, an external signal which is input the scan output circuit 400 is an inverted scan enable signal SEN unlike FIG. 2.

The scan output circuit 400 may receive a signal output from the fifth node SC and the external signal. As described above, the output signal is a signal output to the fifth node SC by the slave latch 200, and the external signal may include the inverted scan enable signal SEN.

When the semiconductor device including the master-slave flip-flop according to some embodiments is not in a scan test mode, a scan enable signal SE is logic low L. Consequently, the inverted scan enable signal SEN is logic high H.

The inverted scan enable signal SEN input to the scan output circuit 400 may be input to the scan output NOR gate 71 in the scan output circuit 400. Further, an output signal, which is input to the scan output circuit 400, may be input to the first scan output inverter 51 so that a first output signal, which is an inversion of the output signal, may be output to a sixth node SD. The first output signal may be input to a second scan output inverter 52 so that a second output signal, which is an inversion of the first output signal, may be output to a final output node SZ.

The scan output NOR gate 71 receives the inverted scan enable signal SEN of logic high H and the second output signal of the final output node SZ and performs a logic NOR operation on the inverted scan enable signal SEN and the second output signal, thereby outputting a scan output signal SO.

In the case of not being in the scan test mode, the scan output signal SO may be fixed to logic low L due to the logic NOR operation.

That is, in the case of not being in the scan test mode, when the scan output signal SO is fixed to logic low L, it may be determined that the semiconductor device including the master-slave flip-flop operates normally.

When the semiconductor device including the master-slave flip-flop according to some embodiments is in the scan test mode, the scan enable signal SE is logic high H. Consequently, the inverted scan enable signal SEN is logic low L.

In this case, the scan output NOR gate 71 receives the inverted scan enable signal SEN of logic low L and the second output signal of the final output node SZ and performs a logic NOR operation on the inverted scan enable signal SEN and the second output signal, thereby outputting the scan output signal SO.

In the scan test mode, the scan output signal SO is equal to the final output signal Q due to the logic NOR operation.

In the semiconductor device including the master-slave flip-flop according to some embodiments, the inverted scan enable signal SEN may be input to ground terminals of a first scan output inverter 51 and a second scan output inverter 52 of the scan output circuit 400.

In the case of not being in the scan test mode, the inverted scan enable signal SEN is logic high H so that the first scan output inverter 51 and the second scan output inverter 52 do not operate. That is, in the case of not being in the scan test mode, the number of unnecessary operations of components in the scan output circuit 400 is reduced so that it is possible to reduce unnecessary power which is consumed by the semiconductor device including the master-slave flip-flop.

In the scan test mode, the inverted scan enable signal SEN is logic low L so that the first scan output inverter 51 and the second scan output inverter 52 may operate as normal inverters. That is, the output signal, which is output to a third node MB, may be directly transmitted to the scan output NOR gate 71, and the scan output signal SO output from the scan output NOR gate 71 may be equal to the final output signal Q.

In the case of not being in the scan test mode, the semiconductor device including the master-slave flip-flop according to some embodiments may prevent operations of the first scan output inverter 51 and the second scan output inverter 52. Further, owing to the inverted scan enable signal SEN input to the ground terminals of the first scan output inverter 51 and the second scan output inverter 52, a path of a leakage current which may occur in the semiconductor device including the master-slave flip-flop is made to be long so that power consumed by the semiconductor device including the master-slave flip-flop may be reduced.

In the case of being in the scan test mode, the first scan output inverter 51 and the second scan output inverter 52 of the semiconductor device including the master-slave flip-flop according to some embodiments may operate as general inverters and have delays extending as much as the first scan output inverter 51 and the second scan output inverter 52. In the scan test mode, it may be preferable to maintain a longer delay and, to this end, a plurality of buffers (or inverters) may be required. When the buffers (or inverters) for delays are added outside the master-slave flip-flop, a proportion of the buffers (or inverters) occupying in the semiconductor device may increase and unnecessary power consumption may increase. Thus, as in the semiconductor device including the master-slave flip-flop according to some embodiments, the first scan output inverter 51 and the second scan output inverter 52, which serve as a plurality of buffers (or inverters) for delays, are embedded in the master-slave flip-flop so that it is possible to reduce areas for delays provided in the semiconductor device and reduce unnecessary power consumption.

Figure 13:
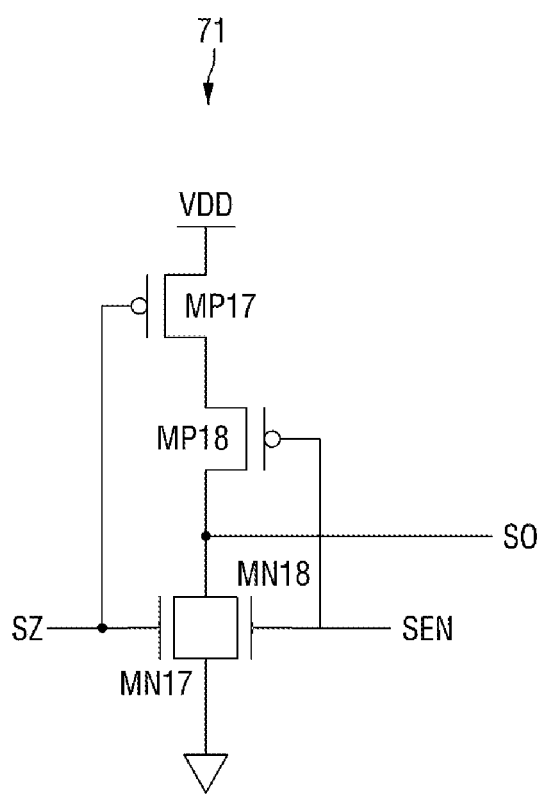
FIG. 13 is a circuit diagram of a scan output NOR gate included in the semiconductor device including the master-slave flip-flop according to some embodiments of FIG. 12.

FIG. 13 is a circuit diagram of a scan output NOR gate included in the semiconductor device including the master-slave flip-flop according to some embodiments of FIG. 12.

Referring to FIG. 13, the scan output NOR gate 71 may include a seventeenth PMOS transistor MP17 and an eighteenth PMOS transistor MP18 which are sequentially connected in series from a power supply voltage VDD, and a seventeenth NMOS transistor MN17 and an eighteenth NMOS transistor MN18 which are connected together by their source terminals and drain terminals. The source terminals of the seventeenth NMOS transistor MN17 and an eighteenth NMOS transistor MN18 may be connected to ground.

A drain terminal of the eighteenth PMOS transistor MP18 may be connected to the drain terminals of the seventeenth NMOS transistor MN17 and the eighteenth NMOS transistor MN18, the seventeenth PMOS transistor MP17 and the seventeenth NMOS transistor MN17 may be gated in response to a voltage level of a final output node SZ, and the eighteenth PMOS transistor MP18 and the eighteenth NMOS transistor MN18 may be gated in response to an inverted scan enable signal SEN.

The drain terminal of the eighteenth PMOS transistor MP18 may output a scan output signal SO through a node connected to the drain terminals of the seventeenth NMOS transistor MN17 and the eighteenth NMOS transistor MN18.

An operation of the scan output NOR gate 71 is the same as the above-described operation of FIG. 12, and thus a description thereof will be omitted below.

Figure 14:
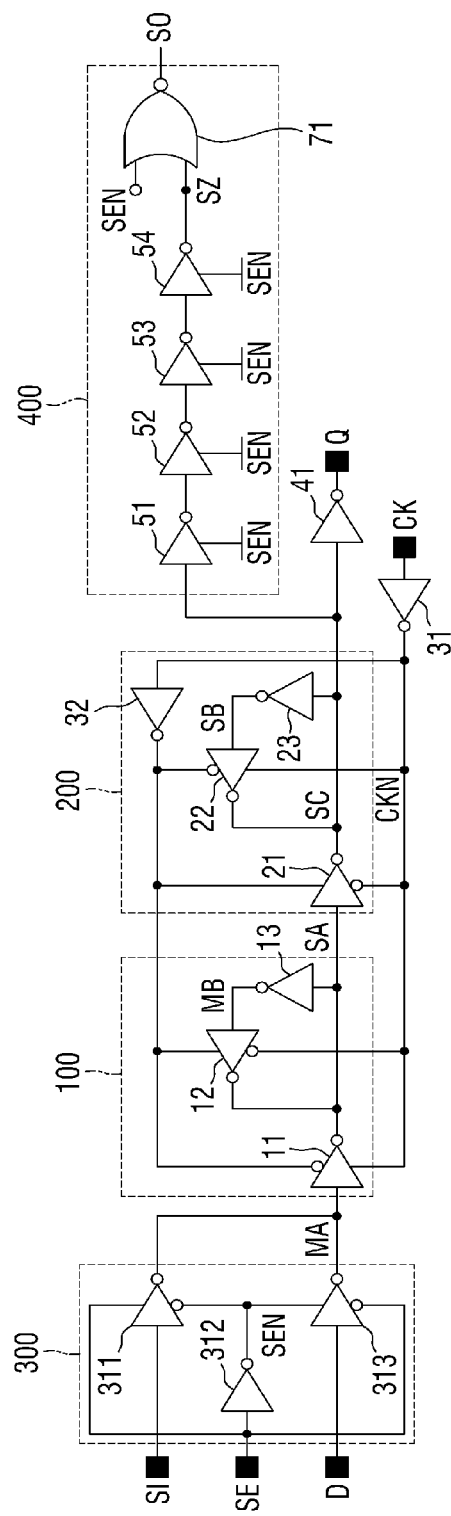
FIG. 14 is a circuit diagram of the semiconductor device including a master-slave flip-flop according to some embodiments of the present disclosure.

FIG. 14 is a circuit diagram of the semiconductor device including a master-slave flip-flop according to some embodiments of the present disclosure.

Referring to FIG. 14, unlike the scan output circuit 400 of FIG. 12, a scan output circuit 400 further includes a third scan output inverter 53 and a fourth scan output inverter 54. Consequently, in the case of being in a scan test mode, a delay time may be made to be longer while a pin polarity of a scan output signal SO is maintained to be equal to that of a final output signal Q.

In a condition in which the pin polarity of the scan output signal SO is maintained to be equal to that of the final output signal Q, the number of scan output inverters in the scan output circuit 400 is not limited to the above configuration, and the scan output circuit 400 may further include 2n scan output inverters (where n is a natural number other than zero).

Other operations and configurations are the same as those of FIG. 12, and thus a duplicate description will be omitted below.

Figure 15:
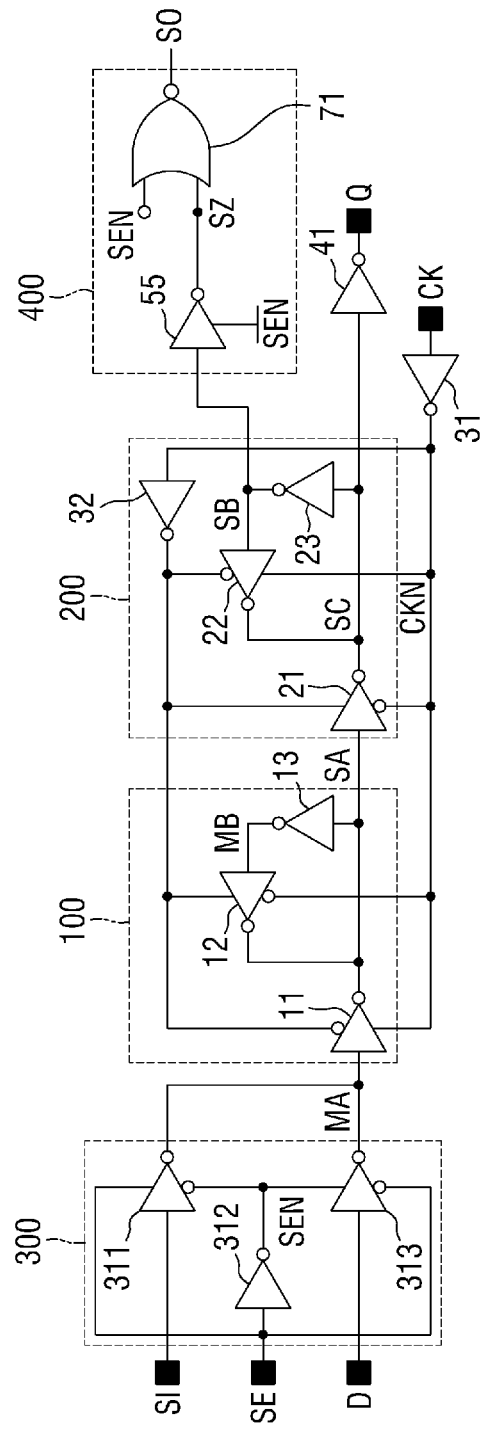
FIG. 15 is a circuit diagram of the semiconductor device including a master-slave flip-flop according to some embodiments of the present disclosure.

FIG. 15 is a circuit diagram of the semiconductor device including a master-slave flip-flop according to some embodiments of the present disclosure.

Referring to FIG. 15, a scan output circuit 400 receives an output signal from a fourth node SB unlike FIGS. 12 and 14. That is, the scan output circuit 400 according to some embodiments may include a fifth scan output inverter 55. The fifth scan output inverter 55 may receive a signal output from the fourth node SB in a slave latch 200 and transmit the inverted output signal to a final output node SZ, and a scan output NOR gate 71 may perform a logic NOR operation on an inverted scan enable signal SEN and a signal of the final output node SZ to output a scan output signal SO.

A detailed operation is similar to that of FIG. 12, and thus a description thereof will be omitted below.

Figure 16:
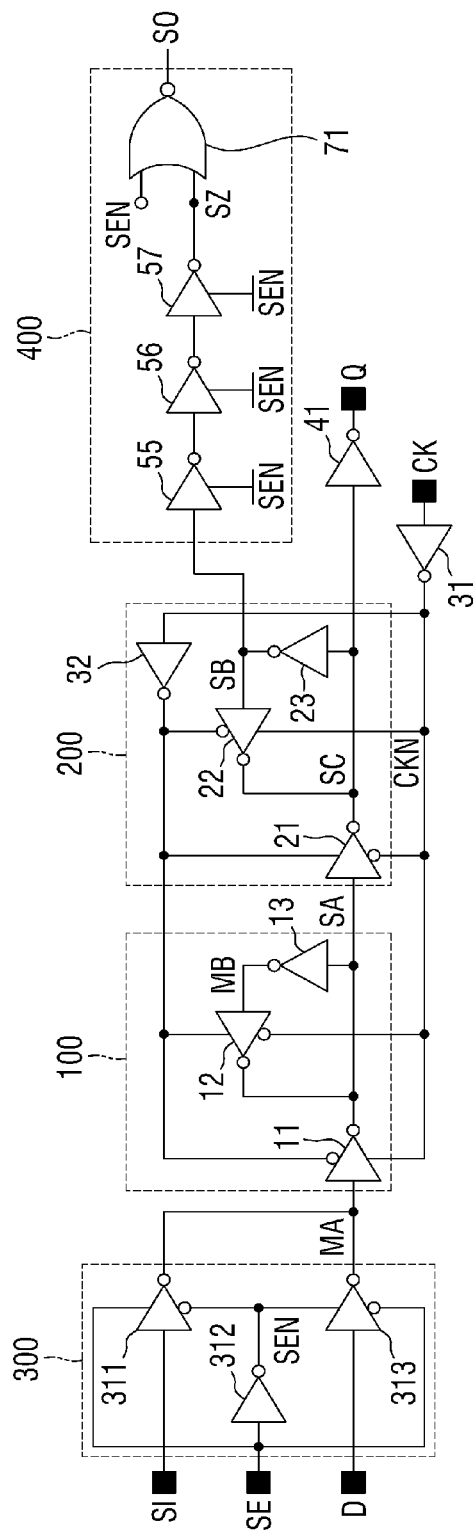
FIG. 16 is a circuit diagram of the semiconductor device including a master-slave flip-flop according to some embodiments of the present disclosure.

FIG. 16 is a circuit diagram of the semiconductor device including a master-slave flip-flop according to some embodiments of the present disclosure.

Referring to FIG. 16, a scan output circuit 400 may further include a sixth scan output inverter 56 and a seventh scan output inverter 57 unlike FIG. 15. Consequently, in the case of being in a scan test mode, a delay time may be made to be longer while a pin polarity of a scan output signal SO is maintained to be equal to that of a final output signal Q.

In a condition in which the pin polarity of the scan output signal SO is maintained to be equal to that of the final output signal Q, the number of scan output inverters in the scan output circuit 400 is not limited to the above configuration, and the scan output circuit 400 may further include 2n+1 scan output inverters (where n is a natural number other than zero).

Other operations and configurations are the same as those of FIG. 15, and thus a duplicate description will be omitted below.

Figure 17:
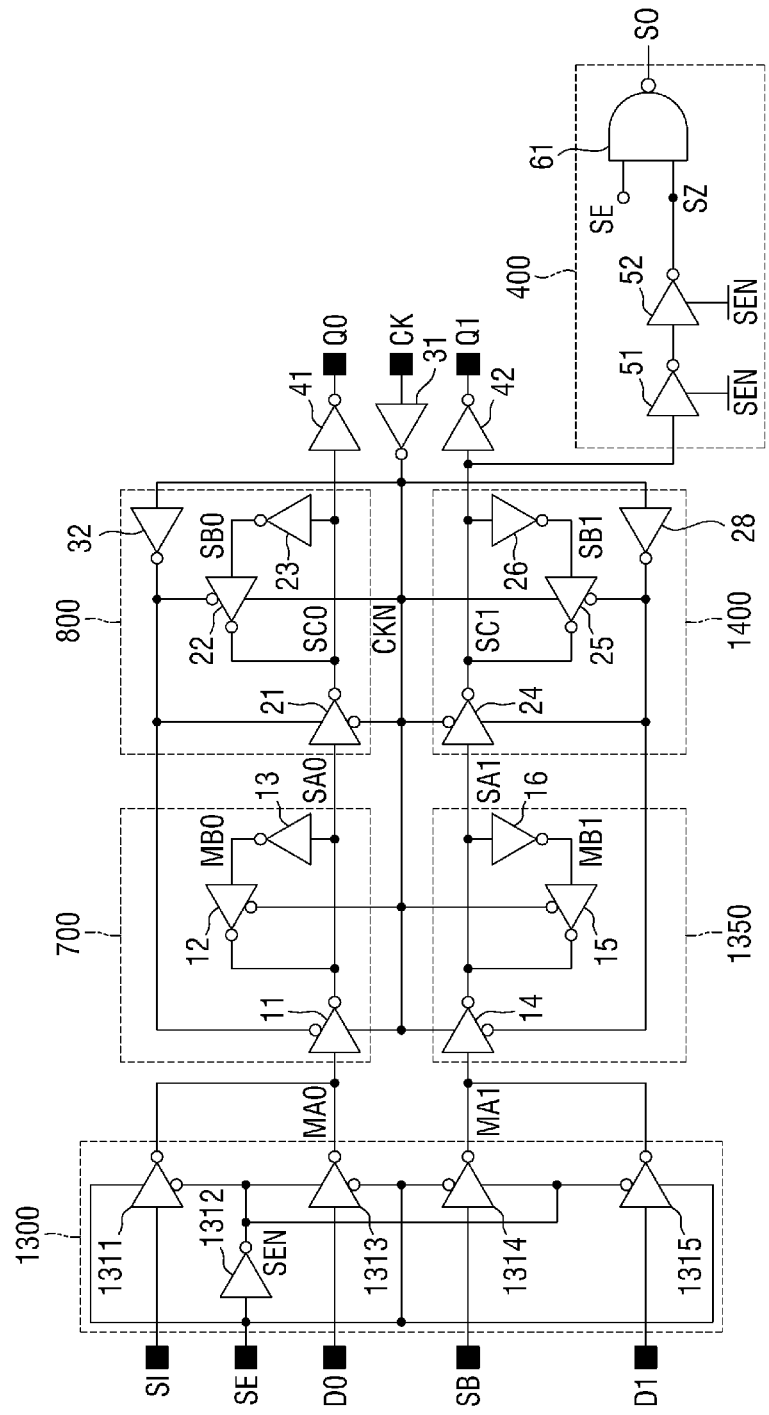
FIG. 17 is a circuit diagram of the semiconductor device including a multi-bit master-slave flip-flop according to some embodiments of the present disclosure.

FIG. 17 is a circuit diagram of the semiconductor device including a multi-bit master-slave flip-flop according to some embodiments of the present disclosure.

Referring to FIG. 17, in some embodiments, the semiconductor device including the multi-bit master-slave flip-flop may store a plurality of data signals D0 and D1 and output signals Q0 and Q1 in response to a scan enable signal SE.

The semiconductor device including a multi-bit master-slave flip-flop may include a multi-bit scan input circuit 1300, a first master latch 700, a first slave latch 800, a second master latch 1350, a second slave latch 1400, and a scan output circuit 400.

The multi-bit scan input circuit 1300 may include a first scan tri-state inverter 1311, a second scan tri-state inverter 1313, a third scan tri-state inverter 1314, a fourth scan tri-state inverter 1315, and a first inverter 1312. The multi-bit scan input circuit 1300 may receive a first data signal D0, a second data signal D1, a first scan input signal SI, a signal of a pre-stage fourth node SB, and the scan enable signal SE. The first inverter 1312 may invert the scan enable signal SE to produce an inverted scan enable signal SEN. In response to the scan enable signal SE, via the inverted scan enable signal SEN, the multi-bit scan input circuit 1300 may output either the first data signal D0 or the first scan input signal SI to a pre-stage first node MA0. In response to the scan enable signal SE, via the inverted scan enable signal SEN, the multi-bit scan input circuit 1300 may output either a second data signal D1 or the signal of the pre-stage fourth-node SB to a pre-stage second node MA1.

The multi-bit scan input circuit 1300 may operate similarly to the scan input circuit 300 which is described above with reference to FIG. 2, except for simultaneously processing two bits. That is, the multi-bit scan input circuit 1300 may selectively output the first data signal D0 and the first scan input signal SI to the pre-stage first node MA0 according to a voltage level of the scan enable signal SE and selectively output the second data signal D1 and the signal of the pre-stage fourth-node SB to a pre-stage second node MA1.

A configuration of the multi-bit scan input circuit 1300 shown in FIG. 17 is merely illustrative, and the present disclosure is not limited thereto. For example, the multi-bit scan input circuit 1300 may be implemented with a plurality of transmission gates, a multiplexer, or logic NAND gates, which will be described below, as shown in FIG. 20.

The first master latch 700 and the first slave latch 800 may store the first data signal D0 and output a first final output signal Q0. The second master latch 1350 and the second slave latch 1400 may store the second data signal D1 and output a second final output signal Q1. The first master latch 700, the first slave latch 800, the second master latch 1350, and the second slave latch 1400 may share a first clock signal CK and a second clock signal CKN.

Configurations and operations of the first master latch 700 and the first slave latch 800, and configurations and operations of the second master latch 1350 and the second slave latch 1400 are the same as those of the master latch 100 and the slave latch 200 which are described with reference to FIG. 2, and thus detailed descriptions thereof will be omitted below. Nodes MB0 and MB1 within FIGS. 17-19 may serve the same purpose and functionality as does the third node MB in master latch 100. Nodes SA0 and SA1 within FIGS. 17-19 may serve the same purpose and functionality as does the second node SA in FIG. 2. Nodes SC0 and SC1 within FIGS. 17-19 may serve the same purpose and functionality as does the fifth node SC in slave latch 200. Nodes SB0 and SB1 within FIGS. 17-19 may serve the same purpose and functionality as does the fourth node SB in slave latch 200.

The second master latch 1350 may include a third input tri-state inverter 14, a third master latch tri-state inverter 15, and a seventh inverter 16.

A configuration and an operation of the second master latch 1350 are similar to those of the first master latch 700 except for outputting the second data signal D1 to a post-stage second node SA1 instead of the first data signal D0 in response to the first clock signal CK and the second clock signal CKN, and thus descriptions thereof will be replaced with the descriptions of the configuration and the operation of the first master latch 700.

The second slave latch 1400 may include a fourth input tri-state inverter 24, a fourth slave latch tri-state inverter 25, an eighth inverter 26, and a ninth inverter 28.

Further, a configuration and an operation of the second slave latch 1400 are similar to those of the first slave latch 800 except for outputting an inverse of the second data signal D1 to a node SC1 instead of outputting the inverse of the first data signal D0 to the node SC0 in response to the first clock signal CK and the second clock signal CKN, and thus descriptions thereof will be replaced with the descriptions of the configuration and the operation of the first slave latch 800.

The scan output circuit 400 of the semiconductor device including the multi-bit master-slave flip-flop according to some embodiments receives an external signal and a signal of the node SC1. Additionally, a tenth inverter 42 inverts the signal of the node SC1 to produce the output signal Q1.

Except that an output signal, which is input to the scan output circuit 400 of the semiconductor device including the multi-bit master-slave flip-flop, is the signal of the node SC1, a configuration and an operation of the scan output circuit 400 are similar to those of the scan output circuits 400 according to some embodiments which are described in FIGS. 2, 8, 12, and 14, and thus descriptions thereof will be omitted below.??

Figure 18:
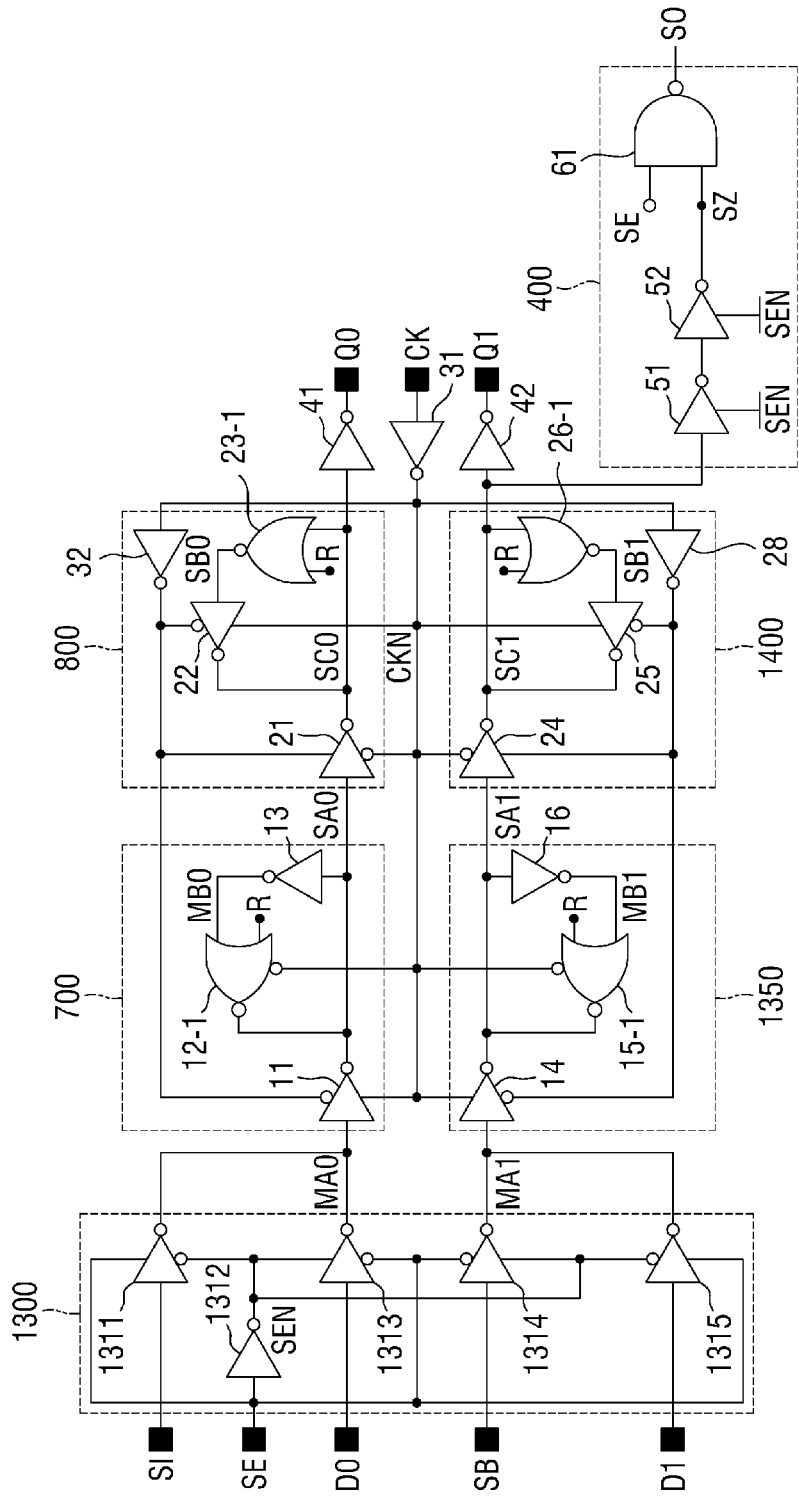
FIG. 18 is a circuit diagram of the semiconductor device including a multi-bit master-slave flip-flop according to some embodiments of the present disclosure.

FIG. 18 is a circuit diagram of the semiconductor device including a multi-bit master-slave flip-flop according to some embodiments of the present disclosure. In FIG. 18, a NOR gate 12-1 has been substituted for the first master latch tri-state inverter 12 in FIG. 17, a NOR gate 15-1 has been substituted for the third master latch tri-state inverter 15 in FIG. 17, a NOR gate 23-1 has been substituted for the third inverter 23 in FIG. 17, and a NOR gate 26-1 has been substituted for the eighth inverter 26 in FIG. 17. Each of NOR gates 12-1, 15-1, 23-1, and 26-1 receives a reset signal R in addition to the signal received by the corresponding component in FIG. 17. For reference, descriptions of an operation and a configuration overlapping those of FIGS. 7 and 17 will be omitted below.

Figure 19:
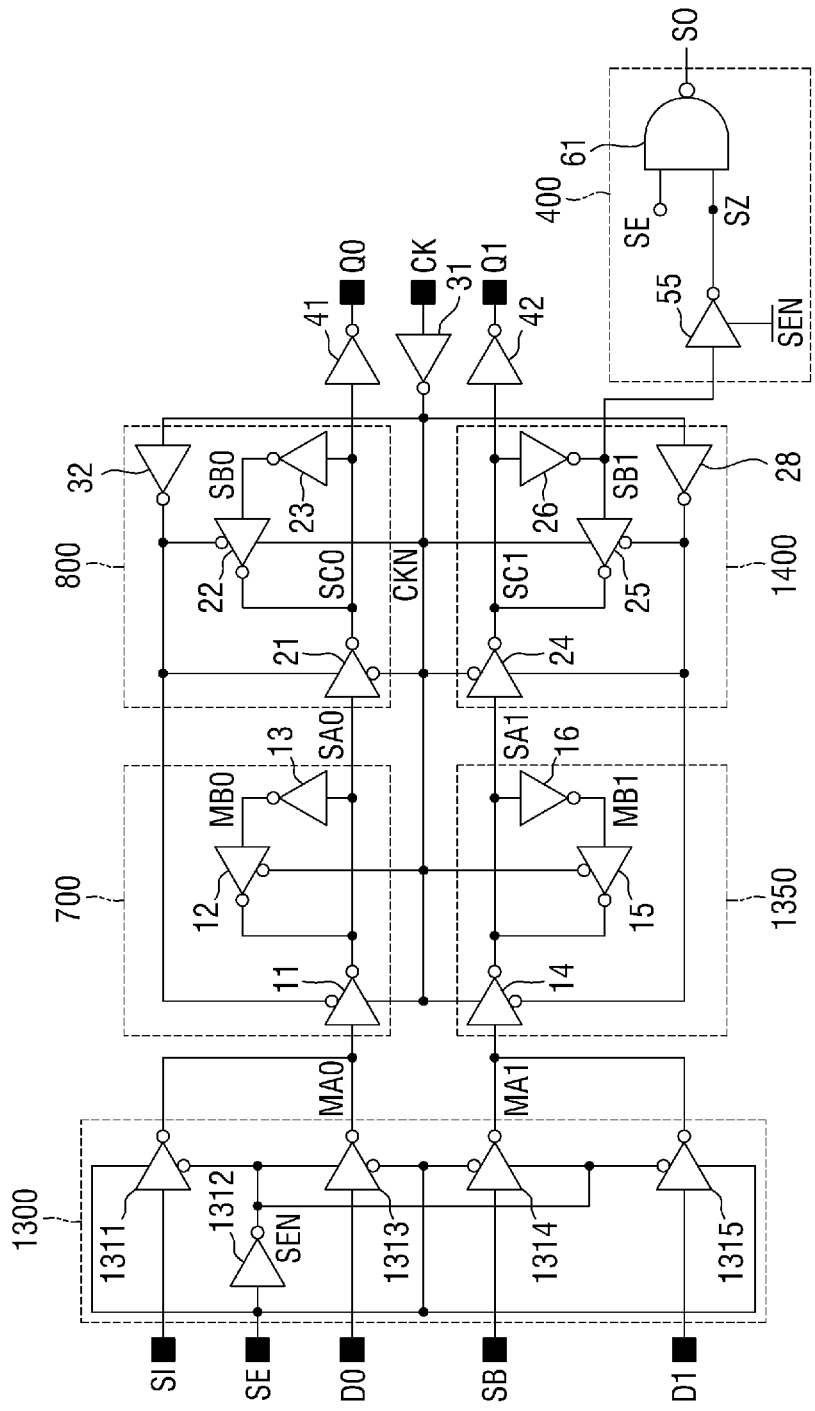
FIG. 19 is a circuit diagram of the semiconductor device including a multi-bit master-slave flip-flop according to some embodiments of the present disclosure.

FIG. 19 is a circuit diagram of the semiconductor device including a multi-bit master-slave flip-flop according to some embodiments of the present disclosure. For reference, descriptions of an operation and a configuration overlapping those of FIG. 17 will be omitted below.

Referring to FIG. 19, a scan output circuit 400 of the semiconductor device including a multi-bit master-slave flip-flop according to some embodiments receives an external signal and a signal of a post-stage fourth node SB1.

Except that an output signal, which is input to the scan output circuit 400 of the semiconductor device including the multi-bit master-slave flip-flop, is the signal of the post-stage fourth node SB1, a configuration and an operation of the scan output circuit 400 are similar to those of the scan output circuits 400 according to some embodiments which are described in FIGS. 9, 11, 15, and 16, and thus descriptions thereof will be omitted below.

FIG. 20 is a circuit diagram of a semiconductor device including two master-slave flip-flops, which are connected in series, according to some embodiments of the present disclosure.

Referring to FIG. 20, each of a pre-stage scan input circuit 300-1 and a post-stage scan input circuit 300-2 may include a plurality of scan input NAND gates. That is, the pre-stage scan input circuit 300-1 may include a first scan input NAND gate 321 which performs a NAND operation on a first scan input signal SI1 and a first scan enable signal SE1 to output a first output signal N1, a second scan input NAND gate 322 which performs a NAND operation on a first inverted scan enable signal SEN1 and a first data signal D1 to output a second output signal N2, and a third scan input NAND gate 323 which performs a NAND operation on the first output signal N1 and the second output signal N2 to output a third output signal N3.

A pre-stage master latch 100-1 and a pre-stage slave latch 200-1 may process the third output signal N3 to output a signal to a node SC1. A pre-stage inverter 41-1 may process the signal presented by node SC1 to output a first final output signal Q1. The signal presented by node SC1 may be input to a pre-stage scan output circuit 400-1. Within pre-stage scan output circuit 400-1, a first pre-stage scan output inverter 51-1, a second pre-stage scan output inverter 52-1, and a pre-stage scan output NAND gate 61-1 may correspond respectively to the first scan output inverter 51, the second scan output inverter 52, and the scan output NAND gate 61 of the scan output circuit 400 within FIG. 2. The pre-stage scan output NAND gate 61-1 may perform a NAND operation on the first scan enable signal SE1 and an output signal of the second pre-stage scan output inverter 52-1 that is provided to a node SZ1 to produce a signal that is presented to node SO1. Each of the first pre-stage scan output inverter 51-1 and the second pre-stage scan output inverter 52-1 may receive the first inverted scan enable signal SEN1 at a ground terminal thereof. An operation of the pre-stage scan output circuit 400-1 is similar to that of the scan output circuit 400 of FIG. 2, and thus a description thereof will be omitted below.

The number of connected master-slave flip-flops is not limited to the above configuration, and three or more master-slave flip-flops may be connected.

A semiconductor device including a pre-stage master-slave flip-flop may be connected in series to a semiconductor device including a post-stage master-slave flip-flop. The pre-stage master-slave flip-flop may include the pre-stage scan input circuit 300-1, the pre-stage master latch 100-1, the pre-stage slave latch 200-1, the pre-stage inverter 41-1, and the pre-stage scan output circuit 400-1.

The post-stage master-slave flip-flop includes the post-stage scan input circuit 300-2, a post-stage master latch 100-2, a post-stage slave latch 200-2, a post-stage inverter 41-2, and post-stage scan output circuit 400-2.

In the semiconductor device including two master-slave flip-flops, which are connected in series, according to some embodiments, when the post-stage scan output circuit 400-1 is connected to the post-stage scan input circuit 300-2, a scan input NAND gate will be omitted.

Since the output signal of the pre-stage slave latch 200-1 is input to the post-stage scan output circuit 400-1 so that a post-stage scan output NAND gate 61-1 serves a function of a scan input NAND gate in the post-stage scan input circuit 300-2, the scan input NAND gate may be omitted from a serially connected portion between two or more master-slave flip-flops.

Owing to omission of the scan input NAND gate, an accurate scan test operation may be implemented in a plurality of serially connected master-slave flip-flops. Further, a characteristic of a scan hold time may be improved through a robust scan test design. This may increase usage probability of improved performance not only in mobile devices, servers, or computers, but also in electric components.

The post-stage scan input circuit 300-2 may include a fourth scan input NAND gate 332. The fourth scan input NAND gate 332 may receive a second data signal D2 and a second scan enable signal SEN2 and perform a NAND operation on the second data signal D2 and the second scan enable signal SEN2 to output a fourth output signal N4. A fifth scan input NAND gate 333 receives and performs a NAND operation on the fourth output signal N4 and the signal presented by node SO1 to output a fifth signal N5. A post-stage master latch 100-2 and a post-stage slave latch 200-2 process the fifth signal N5 to output a signal to a fifth post-stage output node SC2. The second post-stage inverter 41-2 may invert a signal of the fifth post-stage output node SC2 to output a second final output signal Q2. The post-stage scan output circuit 400-2 may receive the signal of the fifth post-stage output node SC2 and an external signal (a second scan enable signal SE2 in the present drawing) to output a second scan output signal SO2. Within post-stage scan output circuit 400-2, a first post-stage scan output inverter 51-2, a second post-stage scan output inverter 52-2, and a post-stage scan output NAND gate 61-2 may correspond respectively to the first scan output inverter 51, the second scan output inverter 52, and the scan output NAND gate 61 of the scan output circuit 400 within FIG. 2. The post-stage scan output NAND gate 61-2 may perform a NAND operation on the second scan enable signal SE2 and an output signal of the second post-stage scan output inverter 52-2 that is provided to a node SZ2. Each of the first post-stage scan output inverter 51-2 and the second post-stage scan output inverter 52-2 may receive the second inverted scan enable signal SEN2 at a ground terminal thereof. An operation of the post-stage scan output circuit 400-2 is the same as that of the scan output circuit 400 of FIG. 2, and thus a description thereof will be omitted below.

Figure 21:
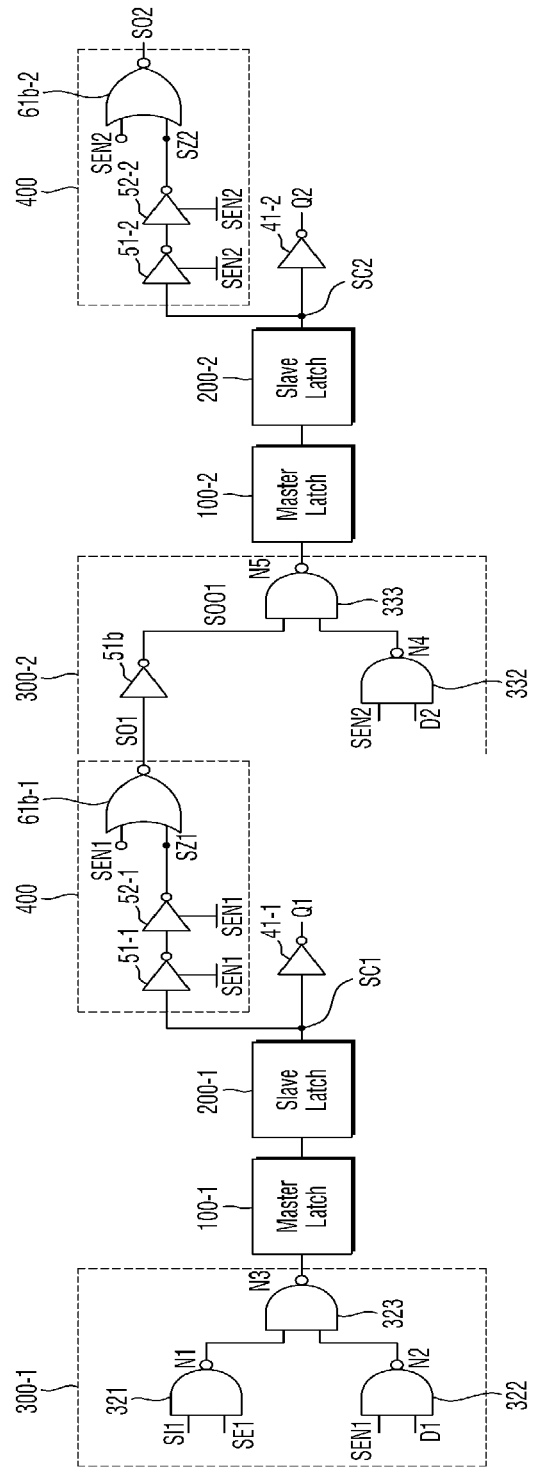
FIG. 21 is a circuit diagram of a semiconductor device including a plurality of serially connected master-slave flip-flops according to some embodiments of the present disclosure.

FIG. 21 is a circuit diagram of a semiconductor device including a plurality of serially connected master-slave flip-flops according to some embodiments of the present disclosure.

Referring to FIG. 21, an operation of a pre-stage scan output circuit 400-1 may be the same as that of FIG. 20 except that the pre-stage scan output circuit 400-1 of FIG. 21 includes a pre-stage scan output NOR gate 61b-1 rather than a pre-stage scan output NAND gate 61-1 as in FIG. 20. Similarly, an operation of a post-stage scan output circuit 400-2 may be the same as that of FIG. 20 except that the post-stage scan output circuit 400-2 of FIG. 21 includes a post-stage scan output NOR gate 61b-2 rather than a post-stage scan output NAND gate 61-2 as in FIG. 20. The pre-stage scan output NOR gate 61b-1 may perform a NOR operation on the first inverted scan enable signal SEN1 and an output signal of the second pre-stage scan output inverter 52-1 that is provided to a node SZ1 so as to produce a signal that is output to node SO1.

Within the post-stage scan input circuit 300-2 of FIG. 21, an inverter 51b inverts the signal presented by node SO1 and provides the inverted signal to a node 5001. And the fifth scan input NAND gate 333 within FIG. 21 receives and performs a NAND operation on the fourth output signal N4 and the signal provided to the node 5001 by inverter 51b to output a fifth signal N5. The post-stage master latch 100-2 and the post-stage slave latch 200-2 process the fifth signal N5 to produce a signal presented to a fifth post-stage output node SC2.

Within the post-stage scan output circuit 400-2 of FIG. 21, the post-stage scan output NOR gate 61b-2 may perform a NAND operation on the second scan enable signal SEN2 and an output signal of the second post-stage scan output inverter 52-2 that is provided to a node SZ2 so as to produce a signal that is output to the second scan output signal SO2. Each of the first post-stage scan output inverter 51-2 and the second post-stage scan output inverter 52-2 may receive the second inverted scan enable signal SEN2 at a ground terminal thereof.

Other features of the embodiment illustrated by FIG. 21 are similar to those of the embodiment illustrated by FIG. 20.

Figure 22:
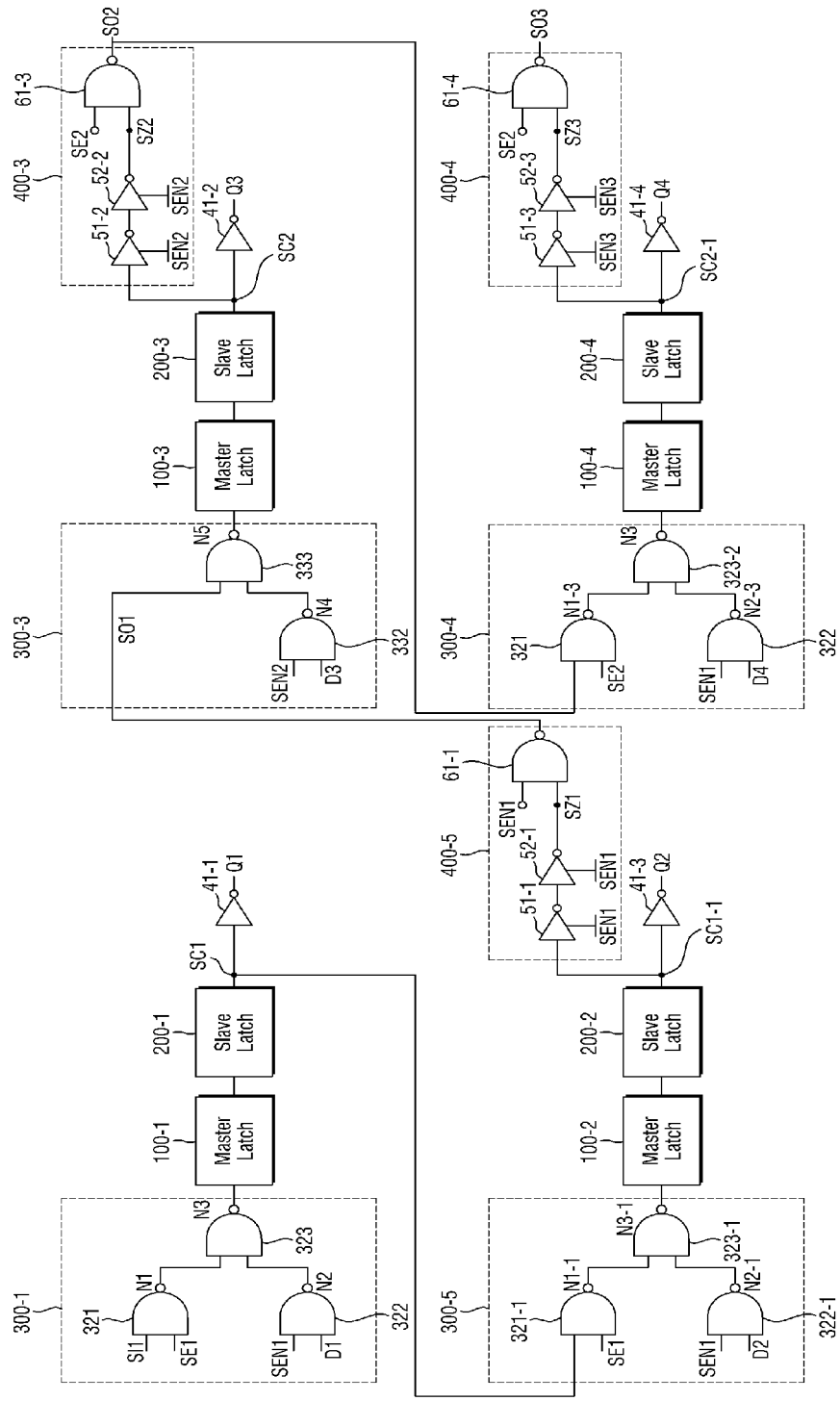
FIGS. 22 and 23 are circuit diagrams of a semiconductor device including serially connected multi-bit master-slave flip-flops.
Figure 23:
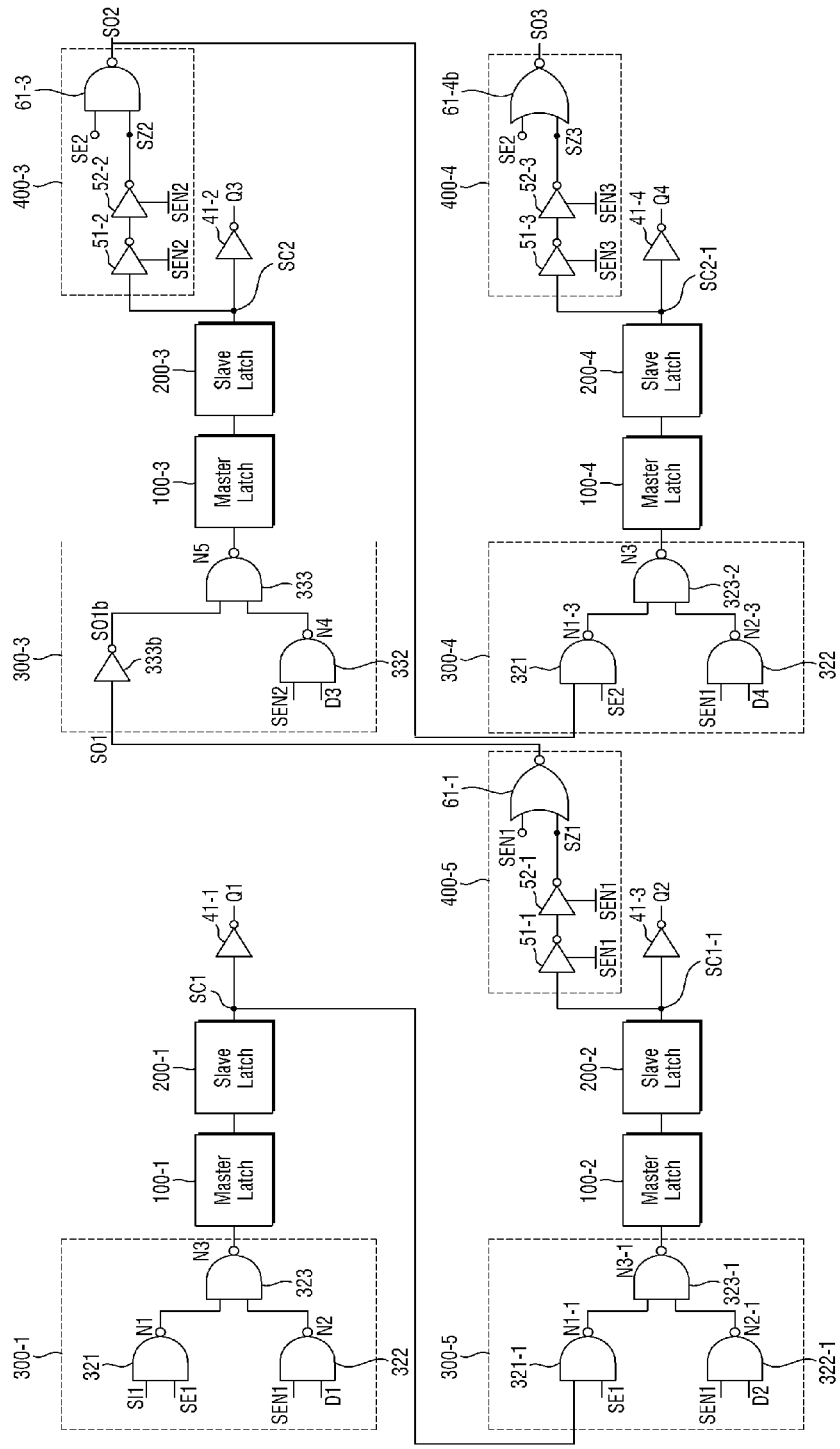

FIGS. 22 and 23 are circuit diagrams of a semiconductor device including serially connected multi-bit master-slave flip-flops.

Referring to FIGS. 22 and 23, a semiconductor device including the serially connected multi-bit master-slave flip-flops may be connected for two bits, but the number of bits for connection is not limited thereto. Configurations and operations are similar to those of FIGS. 19, 20, and 21, and thus duplicate descriptions will be omitted below. When the multi-bit master-slave flip-flops are connected, a NAND gate may be omitted to reduce overhead. Further, in the case of not being in a scan test mode, toggle of a first scan output node SO1 may be completely blocked so that there may be an effect of reducing switching power.

FIG. 22 includes the pre-stage scan input circuit 300-1, pre-stage master latch 100-1, pre-stage slave latch 200-1, and pre-stage inverter 41-1 illustrated in FIGS. 21 and 22. Additionally, FIG. 22 may include a second-stage scan input circuit 300-5 having a first second-stage NAND gate 321-1, a second second-stage NAND gate 322-1, and a third second-stage NAND gate 323-1. The first second-stage NAND gate 321-1 may perform a NAND operation on a signal provided by a node SC1 and a first scan enable signal SE1 to output a signal N1-1. The second second-stage NAND gate 322-1 may perform a NAND operation on a first inverted scan enable signal SEN1 and a second data signal D2 to output a second output signal N2-1. The third second-stage NAND gate 323-1 may perform a NAND operation on the signal N1-1 and the signal N2-1 to output a second output signal N3-1.

A second-stage master latch 100-2 and a second-stage slave latch 200-2 may perform operations respectively similar to those of the pre-stage master latch 100-1 and the pre-stage slave latch 200-1, but may do so on the second output signal N3-1 rather than on the signal provided by node SC1. The second-stage slave latch 200-2 may output a signal to node SC1-1.

The signal provided to node SC1-1 may be input to a first-stage scan output circuit 400-5. Within first-stage scan output circuit 400-5, a first first-stage scan output inverter 51-1, a second first-stage scan output inverter 52-1, and a first-stage scan output NAND gate 61-1 may correspond respectively to the first scan output inverter 51, the second scan output inverter 52, and the scan output NAND gate 61 of the scan output circuit 400 within FIG. 2. The first first-stage scan output inverter 51-1 inverts the signal provided to node SC1-1 and the second first-stage scan output inverter 52-1 inverts the signal output by the first first-stage scan output inverter 51-1. The first-stage scan output NAND gate 61-1 may perform a NAND operation on the first inverted scan enable signal SEN1 and an output signal of the second first-stage scan output inverter 52-1 that is provided to a node SZ1 so as to provide a signal to a node S01. Each of the first first-stage scan output inverter 51-1 and the second first-stage scan output inverter 52-1 may receive the first inverted scan enable signal SEN1 at a ground terminal thereof. An operation of the pre-stage scan output circuit 400-5 is similar to that of the scan output circuit 400 of FIG. 2, and thus a description thereof will be omitted below.

Additionally, the signal provided to node SC1-1 may be input to a second-stage inverter 41-3 that outputs a signal Q2.

A third-stage scan input circuit 300-3 may have a first third-stage NAND gate 332 and a second third-stage NAND gate 333. The first third-stage NAND gate 332 may perform a NAND operation on a second inverted scan enable signal SEN2 and a third data signal D3 to output a fourth output signal N4. The second third-stage NAND gate 333 may perform a NAND operation on the fourth output signal N4 and the signal received from node SO1 to output a fifth output signal N5.

A third-stage master latch 100-3 and a third-stage slave latch 200-3 may perform operations respectively similar to those of the second-stage master latch 100-2 and the second-stage slave latch 200-2, but may do so on the second output signal N5 rather than on the signal N3-1. The third-stage slave latch 200-3 may output a signal to node SC2.

The signal provided to node SC2 may be input to a second-stage scan output circuit 400-3. Within second-stage scan output circuit 400-3, a first second-stage scan output inverter 51-2, a second second-stage scan output inverter 52-2, and a second-stage scan output NAND gate 61-3 may correspond respectively to the first scan output inverter 51, the second scan output inverter 52, and the scan output NAND gate 61 of the scan output circuit 400 within FIG. 2. The first second-stage scan output inverter 51-2 inverts the signal provided to node SC2 and the second second-stage scan output inverter 52-2 inverts the signal output by the first second-stage scan output inverter 51-2. The second-stage scan output NAND gate 61-3 may perform a NAND operation on the second scan enable signal SE2 and an output signal of the second second-stage scan output inverter 52-2 that is provided to a node SZ2 so as to provide a signal to a node SO2. Each of the first second-stage scan output inverter 51-2 and the second second-stage scan output inverter 52-2 may receive the second inverted scan enable signal SEN2 at a ground terminal thereof. An operation of the second-stage scan output circuit 400-3 is similar to that of the scan output circuit 400 of FIG. 2, and thus a description thereof will be omitted below.

Additionally, the signal provided to node SC2 may be input to a third-stage inverter 41-2 that outputs a signal Q3.

A fourth-stage scan input circuit 300-4 may have a first fourth-stage NAND gate 321, a second fourth-stage NAND gate 322, and a third fourth-stage NAND gate 323-2. The first fourth-stage NAND gate 321 may perform a NAND operation on a signal provided by a node SO2 and a second scan enable signal SE2 to output a signal N1-3. The second fourth-stage NAND gate 322 may perform a NAND operation on a first inverted scan enable signal SEN1 and a fourth data signal D4 to output a second output signal N2-3. The third fourth-stage NAND gate 323-2 may perform a NAND operation on the signal N1-3 and the signal N2-3 to output a third output signal N3.

A fourth-stage master latch 100-4 and a fourth-stage slave latch 200-4 may perform operations respectively similar to those of the second-stage master latch 100-2 and the second-stage slave latch 200-2, but may do so on the second output signal N3 rather than on the signal N3-1. The fourth-stage slave latch 200-4 may output a signal to node SC2-1.

The signal provided to node SC2-1 may be input to a third-stage scan output circuit 400-4. Within third-stage scan output circuit 400-4, a first third-stage scan output inverter 51-3, a second third-stage scan output inverter 52-3, and a third-stage scan output NAND gate 61-4 may correspond respectively to the first scan output inverter 51, the second scan output inverter 52, and the scan output NAND gate 61 of the scan output circuit 400 within FIG. 2. The first third-stage scan output inverter 51-3 inverts the signal provided to node SC2-1 and the second third-stage scan output inverter 52-3 inverts the signal output by the first third-stage scan output inverter 51-3. The third-stage scan output NAND gate 61-4 may perform a NAND operation on the second scan enable signal SE2 and an output signal of the second third-stage scan output inverter 52-3 that is provided to a node SZ3 so as to provide a signal to a node SO3. Each of the first third-stage scan output inverter 51-3 and the second third-stage scan output inverter 52-3 may receive the first inverted scan enable signal SEN3 at a ground terminal thereof. An operation of the second-stage scan output circuit 400-3 is similar to that of the scan output circuit 400 of FIG. 2, and thus a description thereof will be omitted below.

Additionally, the signal provided to node SC2-1 may be input to a fourth-stage inverter 41-4 that outputs a signal Q4.

The embodiment illustrated by FIG. 23 differs from the embodiment illustrated by FIG. 22 in that a scan output NOR gate 61-2b is substituted for the first-stage scan output NAND gate 61-1 within first-stage scan output circuit 400-5 of FIG. 22. Scan output NOR gate 61-2b may perform a NOR operation on the first inverted scan enable signal SEN1 and an output signal of the second first-stage scan output inverter 52-1 that is provided to a node SZ1 so as to provide a signal to a node SO1. Additionally, third-stage scan input circuit 300-3 may include a third-stage scan input circuit inverter 333b that inverts the signal provided to node SO1 to produce a signal SO1b, which is provided to the second third-stage NAND gate 333 instead of the signal received from node SO1 as occurs in the embodiment illustrated by FIG. 22. Still further, a scan output NOR gate 61-4b is substituted for the third-stage scan output NAND gate 61-4 within FIG. 22. Scan output NOR gate 61-4b may perform a NOR operation on the second scan enable signal SE2 and an output signal of the second third-stage scan output inverter 52-3 that is provided to a node SZ3 so as to provide a signal to a node SO3.

FIG. 24 is an exemplary block diagram of an electronic system including a semiconductor device including a master-slave flip-flop according to some embodiments of the present disclosure.

Referring to FIG. 24, an electronic system 10000 may include a main processor 11010, a working memory 12000, a storage device 13000, a communication block 14000, a user interface 15000, and a bus 16000. For example, the electronic system 10000 may be one among electronic devices such as a desktop computer, a laptop computer, a tablet computer, a smart phone, a wearable device, a video game console, a workstation, a server, an infotainment device for a vehicle, an advanced driver assistance system (ADAS) device, and the like.

The main processor 11010 may control an overall operation of the electronic system 10000. The main processor 11010 may process various kinds of arithmetic operations and/or logic operations. To this end, the main processor 11010 may include a special-purpose circuit (e.g., a field programmable gate array (FPGA)), application specific integrated circuits (ASICs), and the like. For example, the main processor 11010 may include one or more processor cores and may be implemented with a general purpose processor, a dedicated processor, or an application processor. The main processor 11010 may include a semiconductor device including a master-slave flip-flop according to some embodiments of the present disclosure, a semiconductor device including a multi-bit master-slave flip-flop, and/or a semiconductor device including a plurality of serially connected master-slave flip-flops.

The working memory 12000 may store data used for an operation of the electronic system 10000. For example, the working memory 12000 may temporarily store data processed or which will be processed by the main processor 11010. For example, the working memory 12000 may include volatile memories such as dynamic random access memories (DRAMs), synchronous DRAMs (SDRAMs), and the like and/or non-volatile memories such as phase change random access memories (PRAMs), magneto-resistive RAMs (MRAMs), resistive RAMs (ReRAMs), ferro-electric RAMs (FRAMs), and the like.

The storage device 13000 may include at least one memory device and a controller. The memory device of the storage device 13000 may store data regardless of a supply of power. For example, the storage device 13000 may include non-volatile memories such as flash memories, PRAMs, MRAMs, ReRAMs, FRAMs, and the like. For example, the storage device 13000 may include storage media such as solid state drives (SSDs), embedded multimedia cards (eMMCs), universal flash storages (UFSs), and the like. The storage device 13000 may include a sensor for measuring an internal temperature. The storage device 13000 may process a command received from the main processor 11010 and then record information, which relates to the internal temperature measured by the sensor, in a command response which is returned to the main processor 11010.

For example, the storage device 13000 may receive a read command from the main processor 11010 and return a command response, which indicates a processing result of the read command, to the main processor 11010. The command response may additionally include the information on the internal temperature of the storage device 13000. In this case, information on whether the read command is successfully performed, information on whether a temperature of the storage device 13000 is lower than a lower reference temperature, and information on whether the temperature of the storage device 13000 is higher than an upper reference temperature may be recorded in the command response with respect to the read command. The main processor 11010 may perform a thermal throttling operation so as to adjust the temperature of the storage device 13000 on the basis of the information, which is received from the storage device 13000, relating to the temperature.

The communication block 14000 may communicate with an external device/system of the electronic system 10000. For example, the communication block 14000 may support at least one among various wireless communication protocols such as long term evolution (LTE), worldwide interoperability for microwave access (WiMAX), a global system for mobile communications (GSM), a code division multiple access (CDMA), Bluetooth, near field communication (NFC), wireless fidelity (Wi-Fi), radio frequency identification (RFID), and the like and/or at least one among various wired communication protocols such as a transfer control protocol/Internet protocol (TCP/IP), a Universal Serial Bus (USB), FireWire, and the like.

The user interface 15000 may arbitrate communication between a user and the electronic system 10000. For example, the user interface 15000 may include an input interface such as a keyboard, a mouse, a keypad, a button, a touch panel, a touch screen, a touch pad, a touch ball, a camera, a microphone, a gyroscope sensor, a vibration sensor, or the like. For example, the user interface 15000 may include an output interface such as a liquid crystal display (LCD) device, a light emitting diode (LED) display device, an organic LED (OLED) display device, an active matrix OLED (AMOLED) display device, a speaker, a motor, or the like.

The bus 16000 may provide a communication path between components of the electronic system 10000. The components of the electronic system 10000 may exchange data with each other based on a bus format of the bus 16000. For example, the bus format may include one or more among various interface protocols such as a USB, a small computer system interface (SCSI), peripheral component interconnect express (PCIe), a mobile PCIe (M-PCIe), an advanced technology attachment (ATA), a parallel ATA (PATA), a serial attached SCSI (SAS), integrated drive electronics (IDE), enhanced IDE (EIDE), nonvolatile memory express (NVMe), a UFS, and the like.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

What is claimed is:

1. A semiconductor device comprising:
    a first scan input NAND gate configured to perform a NAND operation on a first scan input signal and a first scan enable signal to output a first output signal;
    a second scan input NAND gate configured to perform a NAND operation on an inverted first scan enable signal and a first data signal to output a second output signal;
    a first scan input circuit including a third scan input NAND gate configured to perform a NAND operation on the first output signal and the second output signal to output a third output signal;
    a first master latch configured to latch the third output signal to output a fourth output signal;
    a first slave latch configured to latch the fourth output signal to output a fifth output signal;
    a first inverter configured to invert the fifth output signal to output a first final output signal;
    a first scan output circuit configured to receive a signal output from the first slave latch and a first external signal to output a first scan output signal;
    a fourth scan input NAND gate configured to perform a NAND operation on an inverted second scan enable signal and a second data signal to output a sixth output signal;
    a second scan input circuit including a fifth scan input NAND gate configured to perform a NAND operation on the first scan output signal and the sixth output signal to output a seventh output signal;
    a second master latch configured to latch the seventh output signal to output an eighth output signal;
    a second slave latch configured to latch the eighth output signal to output a ninth output signal;
    a second inverter configured to invert the ninth output signal to output a second final output signal; and
    a second scan output circuit configured to receive a signal output from the second slave latch and a second external signal to output a second scan output signal.

2. The semiconductor device of claim 1, wherein:
the signal output from the first slave latch includes the fifth output signal; and
the first scan output circuit includes:
a first scan output inverter configured to invert the fifth output signal to output a tenth output signal; and
a second scan output inverter configured to invert the tenth output signal to output an eleventh output signal,
wherein ground terminals of the first scan output inverter and the second scan output inverter receive an inverted first scan enable signal.

3. The semiconductor device of claim 2, wherein:
the first scan output circuit includes a scan output NAND gate configured to receive the external signal and the eleventh output signal and perform a logical operation on the external signal and the eleventh output signal; and
the external signal includes the first scan enable signal.

4. The semiconductor device of claim 1, wherein:
the first slave latch includes a third inverter;
the third inverter inverts the fourth output signal to output a tenth output signal; and
the external signal includes an inverted first scan enable signal.

5. The semiconductor device of claim 4, wherein the first scan output circuit includes:
a first scan output inverter configured to invert the tenth output signal to output an eleventh output signal; and
a second scan output inverter configured to invert the eleventh output signal to output a twelfth output signal,
wherein ground terminals of the first scan output inverter and the second scan output inverter receive an inverted first scan enable signal.

6. A semiconductor device comprising:
a first scan input circuit configured to receive a scan input signal, a first data signal, and a scan enable signal and select any one of the first data signal and the scan input signal in response to the scan enable signal to output a first select signal;
a first master latch configured to latch the first select signal to output a first output signal;
a first slave latch configured to latch the first output signal to output a second output signal, wherein the first slave latch includes a first reset NOR gate, and the reset NOR gate configured to perform NOR operation with a reset signal and the second output signal and output a third output signal;
a second scan input circuit configured to receive the third output signal, a second data signal, and the scan enable signal and select any one of the second data signal and the third output signal in response to the scan enable signal to output a second select signal;
a second master latch configured to latch the second select signal to output a fourth output signal;
a second slave latch configured to latch the fourth select signal to output a fifth output signal; and
a scan output circuit configured to receive a signal output from the second slave latch and an external signal to output a first scan output signal.

7. The semiconductor device of claim 6, wherein:
the scan output circuit includes:
a first scan output inverter configured to invert the fifth output signal to output a sixth output signal; and
a second scan output inverter configured to invert the sixth output signal to output a seventh output signal,
wherein ground terminals of the first scan output inverter and the second scan output inverter receive an inverted scan enable signal.

8. The semiconductor device of claim 7, wherein:
the scan output circuit includes a scan output NAND gate configured to receive the external signal and the seventh output signal and perform a logic operation on the external signal and the seventh output signal to output a scan output signal; and
the external signal includes the scan enable signal.

9. The semiconductor device of claim 7, wherein:
the scan output circuit includes a scan output NOR gate configured to receive the external signal and the seventh output signal and perform a logic operation on the external signal and the seventh output signal to output a scan output signal; and
the external signal includes the inverted scan enable signal.

10. A semiconductor device comprising:
a first scan input NAND gate configured to perform a NAND operation on a first scan input signal and a first scan enable signal to output a first output signal;
a second scan input NAND gate configured to perform a NAND operation on an inverted first scan enable signal and a first data signal to output a second output signal;
a first scan input circuit including a third scan input NAND gate configured to perform a NAND operation on the first output signal and the second output signal to output a third output signal;
a first master latch configured to latch the third output signal to output a fourth output signal;
a first slave latch configured to latch the fourth output signal to output a fifth output signal;
a first inverter configured to invert the fifth output signal to output a first final output signal;
a first scan output circuit configured to receive a signal output from the first slave latch and a first external signal to output a first scan output signal;
a fourth scan input NAND gate configured to perform a NAND operation on an inverted second scan enable signal and a second data signal to output a sixth output signal;
a second scan input circuit including a fifth scan input NAND gate configured to perform a NAND operation on an inverted first scan output signal and the sixth output signal to output a seventh output signal;
a second master latch configured to latch the seventh output signal to output an eighth output signal;
a second slave latch configured to latch the eighth output signal to output a ninth output signal;
a second inverter configured to invert the ninth output signal to output a second final output signal; and
a second scan output circuit configured to receive a signal output from the second slave latch and a second external signal to output a second scan output signal.

11. The semiconductor device of claim 10, wherein:
the signal output from the first slave latch includes the fifth output signal; and
the first scan output circuit includes:
a first scan output inverter configured to invert the fifth output signal to output a tenth output signal; and
a second scan output inverter configured to invert the tenth output signal to output an eleventh output signal,
wherein ground terminals of the first scan output inverter and the second scan output inverter receive an inverted first scan enable signal.

12. The semiconductor device of claim 11, wherein:
the first scan output circuit includes a scan output NOR gate configured to receive the external signal and the eleventh output signal and perform a logical operation on the external signal and the eleventh output signal; and
the external signal includes the inverted first scan enable signal.

13. The semiconductor device of claim 10, wherein:
the first slave latch includes a third inverter;
the third inverter inverts the fourth output signal to output a tenth output signal; and
the external signal includes an inverted first scan enable signal.

14. The semiconductor device of claim 13, wherein the first scan output circuit includes:
a first scan output inverter configured to invert the tenth output signal to output an eleventh output signal; and
a second scan output inverter configured to invert the eleventh output signal to output a twelfth output signal, wherein ground terminals of the first scan output inverter and the second scan output inverter receive an inverted first scan enable signal.

* * * * *